US011821084B2

United States Patent
Hamalainen et al.

(10) Patent No.: US 11,821,084 B2
(45) Date of Patent: Nov. 21, 2023

(54) ATOMIC LAYER DEPOSITION OF RHENIUM CONTAINING THIN FILMS

(71) Applicant: ASM IP HOLDING B.V., Almere (NL)

(72) Inventors: Jani Hamalainen, Espoo (FI); Mikko Ritala, Espoo (FI); Markku Leskela, Espoo (FI)

(73) Assignee: ASM IP Holding, B.V., Almere (NL)

( * ) Notice: Subject to any disclaimer, the term of this patent is extended or adjusted under 35 U.S.C. 154(b) by 0 days.

(21) Appl. No.: 17/448,586

(22) Filed: Sep. 23, 2021

(65) Prior Publication Data

US 2022/0002868 A1 Jan. 6, 2022

Related U.S. Application Data

(63) Continuation of application No. 16/835,849, filed on Mar. 31, 2020, now Pat. No. 11,155,917, which is a (Continued)

(51) Int. Cl.
| | |
|---|---|
| *C23C 16/455* | (2006.01) |
| *C23C 16/08* | (2006.01) |
| *C23C 16/30* | (2006.01) |
| *C23C 16/06* | (2006.01) |
| *C23C 16/34* | (2006.01) |

(52) U.S. Cl.
CPC ........ *C23C 16/45534* (2013.01); *C23C 16/06* (2013.01); *C23C 16/08* (2013.01); *C23C 16/305* (2013.01); *C23C 16/34* (2013.01); *C23C 16/45553* (2013.01)

(58) Field of Classification Search
CPC .. C23C 16/08; C23C 16/305; C23C 16/45553
See application file for complete search history.

(56) References Cited

U.S. PATENT DOCUMENTS

| | | |
|---|---|---|
| 4,368,115 A | 1/1983 | Chianelli et al. |
| 5,169,685 A | 12/1992 | Woodruff et al. |
| | (Continued) | |

FOREIGN PATENT DOCUMENTS

| | | |
|---|---|---|
| JP | H04340254 | 11/1992 |
| JP | 2004346401 | 12/2004 |
| | (Continued) | |

OTHER PUBLICATIONS

Bosi, Matteo, "Growth and synthesis of mono and few-layers transition metal dichalcogenides by vapour techniques: a review", RSC Adv., 5, 2015, pp. 75500-75518.
(Continued)

*Primary Examiner* — Elizabeth A Burkhart
(74) *Attorney, Agent, or Firm* — Banner & Witcoff, Ltd.

(57) ABSTRACT

Methods for depositing rhenium-containing thin films are provided. In some embodiments metallic rhenium-containing thin films are deposited. In some embodiments rhenium sulfide thin films are deposited. In some embodiments films comprising rhenium nitride are deposited. The rhenium-containing thin films may be deposited by cyclic vapor deposition processes, for example using rhenium halide precursors. The rhenium-containing thin films may find use, for example, as 2D materials.

21 Claims, 35 Drawing Sheets

Related U.S. Application Data continuation of application No. 15/827,988, filed on Nov. 30, 2017, now Pat. No. 10,619,242.

(60) Provisional application No. 62/516,282, filed on Jun. 7, 2017, provisional application No. 62/448,211, filed on Jan. 19, 2017, provisional application No. 62/429,527, filed on Dec. 2, 2016.

(56) References Cited

U.S. PATENT DOCUMENTS

| | | | |
|---|---|---|---|
| 5,577,263 | A | 11/1996 | West |
| 6,238,734 | B1 | 5/2001 | Senzaki et al. |
| 6,537,613 | B1 | 3/2003 | Senzaki et al. |
| 10,619,242 | B2 | 4/2020 | Hamalainen et al. |
| 2002/0182320 | A1 | 12/2002 | Leskela et al. |
| 2005/0101130 | A1 | 5/2005 | Lopatin et al. |
| 2006/0029748 | A1 | 2/2006 | Ishizaka et al. |
| 2008/0102205 | A1 | 5/2008 | Barry et al. |
| 2008/0274617 | A1 | 11/2008 | Milligan |
| 2009/0163383 | A1 | 6/2009 | Sun et al. |
| 2010/0075037 | A1 | 3/2010 | Marsh et al. |
| 2015/0118487 | A1* | 4/2015 | Wolden .............. C03C 17/3464 204/192.15 |
| 2016/0122868 | A1* | 5/2016 | Kim .................. C23C 16/52 427/255.35 |
| 2018/0155832 | A1 | 6/2018 | Hamalainen et al. |

FOREIGN PATENT DOCUMENTS

| | | |
|---|---|---|
| JP | 2007046105 | 2/2007 |
| KR | 10-2005-0061728 A | 6/2005 |
| KR | 101535573 | 7/2015 |
| KR | 20150098904 | 8/2015 |
| WO | WO 2016/191432 | * 12/2016 |

OTHER PUBLICATIONS

Feng et al., "Raman vibrational spectra of bulk to monolayer $ReS_2$ with lower symmetry", Phys. Rev. B. 92, Issue 5, 2015. pp. 054110-1-054110-6.

Fujita et al., "Chemically Exfoliated $ReS_2$ Nanosheets", Nanoscale, 6, 2014, pp. 12458-12462.

He et al., "Chemical Vapor Deposition of High-Quality and Atomically Layered $ReS_2$", Small Journal, 2015, 11, No. 40, pp. 5423-5429.

Johnson, Dexter, "Rhenium Disulfide: A New 3-D Material That Has the Electronic Properties of a 2-D Material", IEEE Spectrum, Mar. 21, 2014, in 3 pages.

Keyshar et al., "Chemical Vapor Deposition of Monolayer Rhenium Disulfide ($ReS_2$)", Advanced Materials, 2015, vol. 27, pp. 4640-4648.

Liu et al., "Integrated digital inverters based on two-dimensional anisotropc $ReS_2$ field-effect transistors", Nature Communications 6, Article No. 6991, May 7, 2015, pp. 1-7.

Sanjaya, Aamir, "Unique Properties of Rhenium Disulfide", Nanotech etc., Apr. 4, 2014, in 2 pages.

She et al., "Highly Dispersed and Active ReOx on Alumina-Modified SBA-15 Silica for 2-Butanol Dehydration", ACS Catal., 2012, 2 (6), pp. 1020-1026.

Tongay et al., "Monolayer behavior in bulk $ReS_2$ due to electronic and vibrational decoupling", Nature Communications 5, Feb. 6, 2014, pp. 1-6.

Xu et al., "Sulfur vacancy activated field effect transistors based on $ReS_2$ nanosheets", Nanoscale, 2015 vol. 7, pp. 15757-15762.

Yarris, Lynn, "Discovery of New Semiconductor Holds Promise for 2D Physics and Electronics", News Center, DOE Office of Science, Mar. 20, 2014, in 4 pages.

Yu et al., "Robust Direct Bandgap Characteristics of One- and Two-Dimensional $ReS_2$", Scientific Reports 5, Article No. 13783, (2015), pp. 1-9.

Zhang et al., "$ReS_2$-Based Field-Effect Transistors and Photodetectors", Advanced Functional Materials, vol. 25, Issue 26, 2015, pp. 4076-4082.

Hamalainen, Ritala, Leskela, "Controlled Etching of ALO Grown ReS2 by O2 Pulses", invention disclosure, submitted to HIS Dec. 19, 2018.

Hämäläinen et al., "Atomic Layer Deposition of Rhenium Disulfide", Adv. Mater. 2018, 30. 1703622, in 6 pages.

Hämäläinen et al. "Rhenium Metal and Rhenium Nitride Thin Films Grown by Atomic Layer Deposition", Angew. Chem. Int. Ed. 2018, 57, pp. 14538-14542.

Shim et al., "High-Performance 2D Rhenium Disulfide (ReS2) Transistors and Photodetectors by Oxygen Plasma Treatment". Adv. Mater. 28 (2016). pp. 6985-6992.

Jul. 25, 2023—(JP) Notice of Reasons for Rejection—App 2022-099676, Eng Tran.

Brorson, M. et al., Rhenium(IV) Sulfide Nanotubes, J. Am. Chem. Soc., 2002, vol. 124, No. 39, pp. 11582-11583.

* cited by examiner

| dep. temp. (°C) | 250 | 275 | 300 | 325 | 350 | 375 | 400 | 425 | 450 | 500 |
|---|---|---|---|---|---|---|---|---|---|---|
| thickness (EDX) (nm) | 1 | 12 | 27 | 33 | 35 | 31 | 22 | 24 | 24 | 27 |
| roughness, $R_q$ (nm) | 3.0 | 3.8 | 2.4 | 2.7 | 2.3 | 2.6 | 2.7 | 2.4 | 2.3 | 3.7 |

*FIG. 20*

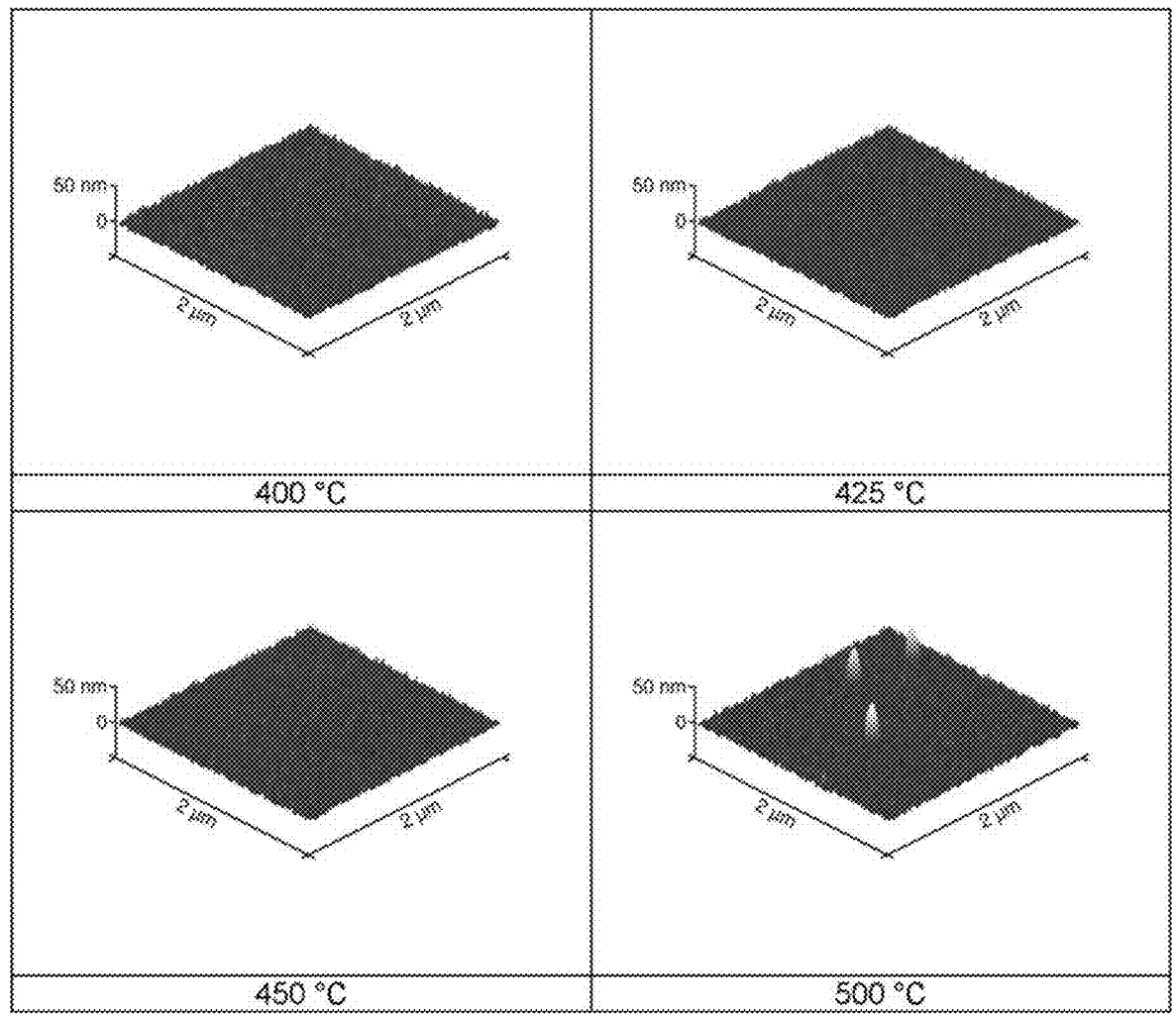
FIG. 21 (Con'd)

| Dep. Temp. | 250 °C | 275 °C | 300 °C | 325 °C | 350 °C | 375 °C | 400 °C | 425 °C | 450 °C | 500 °C |
|---|---|---|---|---|---|---|---|---|---|---|
| d (nm) (EDX) | 1 | 12 | 27 | 33 | 35 | 31 | 22 | 24 | 25 | 27 |
| Re (at.%) | 8.00 ± 1.41 | 63.09 ± 1.31 | 64.82 ± 0.99 | 71.74 ± 1.06 | 82.98 ± 1.27 | 92.55 ± 1.54 | 97.84 ± 1.87 | 97.73 ± 1.85 | 96.50 ± 1.87 | 95.15 ± 1.91 |
| N (at.%) | 4.56 ± 1.64 | 23.11 ± 1.76 | 31.11 ± 1.50 | 26.30 ± 1.39 | 15.90 ± 1.19 | 6.22 ± 0.86 | 0.95 ± 0.39 | 0.76 ± 0.33 | 0.59 ± 0.29 | 2.88 ± 0.73 |
| Cl (at.%) | 18.01 ± 3.48 | 2.86 ± 0.49 | 1.15 ± 0.24 | 0.58 ± 0.17 | 0.31 ± 0.13 | 0.60 ± 0.21 | 0.94 ± 0.31 | 0.98 ± 0.32 | 1.19 ± 0.37 | 1.15 ± 0.39 |
| H (at.%) | 11.97 ± 5.49 | 2.26 ± 0.98 | 1.07 ± 0.48 | 0.57 ± 0.28 | 0.39 ± 0.28 | 0.34 ± 0.30 | 0.17 ± 0.24 | 0.27 ± 0.32 | 1.67 ± 0.89 | 0.54 ± 0.44 |
| C (at.%) | 3.09 ± 1.86 | 0.85 ± 0.33 | 0.15 ± 0.10 | 0.23 ± 0.13 | 0.25 ± 0.15 | 0.30 ± 0.20 | 0.10 ± 0.14 | 0.27 ± 0.22 | 0.05 ± 0.09 | 0.27 ± 0.22 |
| O (at.%) | 54.37 ± 3.25 | 7.83 ± 0.50 | 1.70 ± 0.12 | 0.58 ± 0.17 | 0.17 ± 0.01 | 0.00 ± 0.00 | 0.00 ± 0.00 | 0.00 ± 0.00 | 0.00 ± 0.00 | 0.00 ± 0.00 |
| N/Re ratio | 0.57 | 0.37 | 0.48 | 0.37 | 0.19 | 0.07 | 0.01 | 0.01 | 0.01 | 0.03 |

FIG. 23

| cycles | 30 | 50 | 100 | 200 | 300 | 500 | 700 | 900 | 1000 | 1500 | 2000 | 3000 | 4000 | 5000 |
|---|---|---|---|---|---|---|---|---|---|---|---|---|---|---|
| d (nm) | 1 | 2 | 1 | 2 | 6 | 9 | 20 | 28 | 35 | 64 | 128 | 173 | 300 | 361 |
| $R_q$ (nm) | 0.7 | 1.1 | 2.3 | 4.5 | 8.2 | 14.3 | 18.5 | 23.2 | 23.1 | 30.7 | 30.5 | 50.8 | 46.8 | 56.4 |

FIG. 38 ReS$_x$: ReCl$_5$ (10/10) + H$_2$S (10/10), 1000 cycles, X °C
Al$_2$O$_3$ nucleation layer (100 cycles AlCl$_3$ + H$_2$O), GIXRD
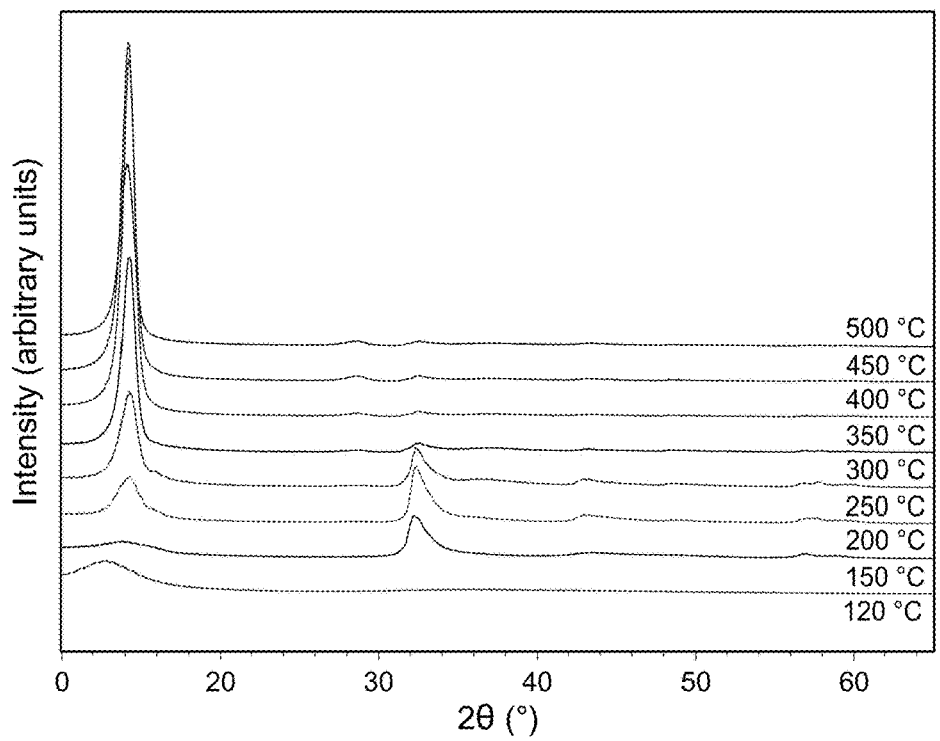
FIG. 39
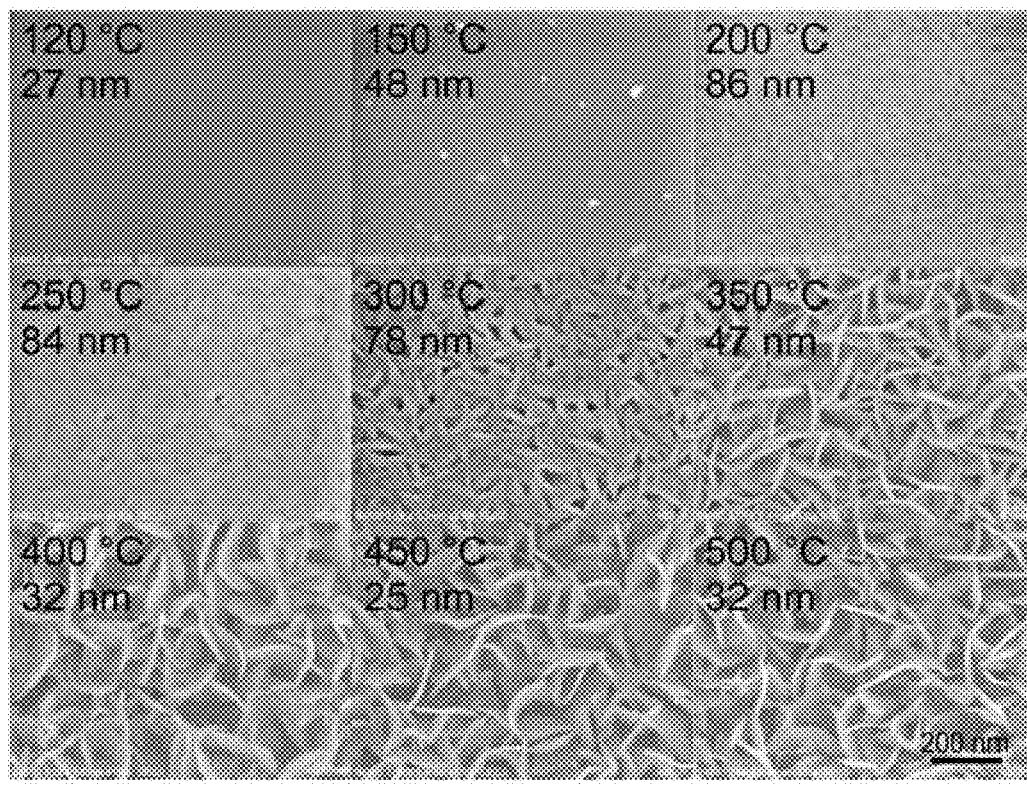

| Dep. Temp. | 120°C | 150°C | 200°C | 250°C | 300°C | 350°C | 400°C | 450°C | 500°C |
|---|---|---|---|---|---|---|---|---|---|
| Re (at.%) | 4.37 ±0.22 | 12.52 ±0.29 | 27.56 ±0.19 | 29.27 ±0.20 | 29.55 ±0.21 | 28.15 ±0.32 | 27.68 ±0.31 | 27.61 ±0.33 | 28.61 ±0.34 |
| S (at.%) | 4.24 ±0.43 | 20.48 ±0.86 | 57.17 ±0.75 | 58.59 ±0.84 | 59.27 ±0.84 | 55.07 ±1.25 | 50.58 ±1.17 | 53.79 ±1.29 | 52.33 ±1.27 |
| O (at.%) | 73.96 ±2.85 | 47.70 ±1.79 | 9.85 ±0.34 | 9.40 ±0.35 | 8.88 ±0.34 | 14.56 ±0.70 | 18.33 ±0.78 | 15.74 ±0.76 | 15.75 ±0.78 |
| C (at.%) | 0.63 ±0.27 | 0.51 ±0.19 | 0.07 ±0.02 | 0.08 ±0.03 | 0.09 ±0.03 | 0.38 ±0.10 | 0.57 ±0.12 | 0.63 ±0.14 | 0.58 ±0.12 |
| H (at.%) | 12.27 ±3.38 | 9.20 ±2.29 | 1.46 ±0.34 | 0.58 ±0.22 | 0.87 ±0.27 | 1.78 ±0.55 | 1.25 ±0.38 | 2.17 ±0.58 | 1.59 ±0.43 |
| Cl (at.%) | 4.54 ±1.77 | 9.59 ±1.91 | 3.89 ±0.25 | 2.08 ±0.13 | 1.33 ±0.08 | 0.06 ±0.01 | 1.60 ±0.16 | 0.05 ±0.01 | 1.14 ±0.12 |
| S/Re ratio | 0.97 | 1.64 | 2.07 | 2.00 | 2.01 | 1.96 | 1.83 | 1.95 | 1.83 |

FIG. 40

| Dep. Temp. | 120° C | 150° C | 200° C | 250° C | 300° C | 350° C | 400° C | 450° C | 500° C |
|---|---|---|---|---|---|---|---|---|---|
| Re (at.%) | 15.39 | 15.99 | 20.13 | 21.27 | 20.99 | 24.01 | 21.90 | 24.99 | 25.34 |
| S (at.%) | 13.43 | 19.63 | 34.51 | 35.80 | 35.07 | 42.20 | 39.96 | 44.66 | 46.93 |
| O (at.%) | 17.20 | 11.13 | 9.15 | 8.56 | 6.97 | 5.29 | 7.18 | 4.63 | 3.70 |
| C (at.%) | 35.76 | 33.69 | 27.78 | 27.67 | 27.06 | 24.35 | 23.29 | 21.57 | 21.51 |
| Cl (at.%) | 12.74 | 16.43 | 4.80 | 2.83 | 6.42 | 1.01 | 0.35 | 0.17 | 0.14 |
| Si (at.%) | 5.49 | 3.14 | 3.63 | 3.87 | 3.46 | 3.16 | 7.33 | 3.96 | 2.37 |
| S/Re ratio | 0.87 | 1.23 | 1.71 | 1.68 | 1.67 | 1.76 | 1.82 | 1.79 | 1.85 |

*FIG. 41*

ATOMIC LAYER DEPOSITION OF RHENIUM CONTAINING THIN FILMS

REFERENCE TO RELATED APPLICATIONS

The present application is a continuation of U.S. application Ser. No. 16/835,849, filed Mar. 31, 2020, which is a continuation of U.S. application Ser. No. 15/827,988, filed Nov. 30, 2017, now U.S. Pat. No. 10,619,242, which claims priority to U.S. Application Nos. 62/429,527, filed Dec. 2, 2016; 62/448,211, filed Jan. 19, 2017; and 62/516,282, filed Jun. 7, 2017, each of which is hereby incorporated by reference.

BACKGROUND

Field of the Invention

The present application relates generally to atomic layer deposition methods for forming rhenium-containing thin films, such as metallic rhenium and rhenium disulfide.

Background

Rhenium thin films find use in a wide variety of different applications. For example, metallic rhenium films may be use in catalysis, in high-temperature superalloys, in superconducting applications and in microelectronics applications. Rhenium disulfide, in contrast, has been shown to behave similarly to 2D materials, even in 3D bulk form. Thus, rhenium disulfide may find applications in tribology, other low-friction applications, solar cell applications and quantum computing and ultrafast data processing.

SUMMARY

Rhenium-containing thin films can be deposited by vapor-deposition processes, such as atomic layer deposition (ALD) or sequential or pulsed chemical vapor deposition (CVD) processes. In some embodiments metallic rhenium-containing thin films are deposited. In some embodiments rhenium sulfide thin films are deposited. In some embodiments films comprising rhenium nitride are deposited. The rhenium-containing thin films may be deposited by cyclic vapor deposition processes, for example using rhenium halide precursors. The rhenium-containing thin films may find use, for example, as 2D materials, as channel materials in a logic device, as a work function metal in a gate stack, as a copper capping layer or as a contact metal layer.

In accordance with one aspect, methods for depositing thin films comprising rhenium on a substrate are provided. The methods may comprise one or more deposition cycles each comprising alternately and sequentially contacting the substrate in a reaction space with a vapor-phase rhenium precursor and a vapor-phase second reactant. In some embodiments two or more deposition cycles are carried out sequentially. The methods may be atomic layer deposition or pulsed or sequential chemical vapor deposition methods.

In some embodiments the thin film that is deposited comprises elemental rhenium or rhenium nitride ($ReN_x$). In some embodiments the thin film comprises both elemental rhenium and rhenium nitride. However, in some embodiments the thin film does not comprise rhenium nitride. In some embodiments the thin film comprises less than 20 at-% H and less than 5 at-% C as impurities. In some embodiments the thin film is deposited on a three-dimensional structure with a step coverage of greater than 90%.

In some embodiments the rhenium precursor is a rhenium halide, such as $ReCl_5$ or $ReF_6$. In some embodiments the second reactant comprises nitrogen, and may comprise, for example, $NH_3$ $N_2$, $NO_2$ or $N_2H_4$. In some embodiments the second reactant is a plasma reactant. For example the second reactant may comprise a plasma generated in a reactant gas such as $H_2$ and/or a noble gas. In some embodiments the second reactant does not comprise oxygen.

In some embodiments, the deposition cycles are carried out at a deposition temperature of about 100 to 600° C. or about 250 to about 500° C.

In some embodiments the thin film is a metallic rhenium thin film having a resistivity of about 10 to 500 microOhmcm.

In accordance with another aspect, cyclic vapor deposition methods for depositing a rhenium-containing thin film on a substrate in a reaction chamber are provided. One or more deposition cycles comprise contacting the substrate with a first vapor-phase rhenium precursor and a second vapor-phase reactant. In some embodiments the methods are atomic layer deposition methods in which the substrate is alternately and sequentially contacted with the first vapor-phase rhenium precursor and the second reactant. The excess precursor or reactant may be removed from the reaction space, along with any reaction byproducts, between the contacting steps. In some embodiments two or more sequential deposition cycles are carried out until a rhenium-containing thin film of a desired thickness has been deposited on the substrate. In some embodiments the rhenium-containing thin film comprises metallic rhenium, rhenium nitride, rhenium sulfide, rhenium oxide or mixtures thereof.

In some embodiments the methods are atomic layer deposition methods, or sequential or pulsed chemical vapor deposition methods.

In some embodiments the methods are carried out at a deposition temperature of about 250 to about 500° C. The vapor-phase rhenium precursor may comprise, for example, a rhenium halide such as $ReCl_5$ or $ReF_6$. In some embodiments the second reactant comprises one or more reactive species formed by generating a plasma in a reactant gas, such as $H_2$ or a combination of $H_2$ and a noble gas.

In some embodiments the rhenium-containing thin film is a rhenium sulfide film, such as $ReS_2$, and the second reactant comprises sulfur. In some embodiments the sulfur precursor comprises hydrogen and sulfur. In some embodiments the sulfur precursor is an alkylsulfur compound. In some embodiments the second reactant comprises one or more of elemental sulfur, $H_2S$, $(CH_3)_2S$, $(NH_4)_2S$, $((CH_3)_2SO)$, and $H_2S_2$. In some embodiments the rhenium sulfide thin film is a two-dimensional material. In some embodiments the rhenium sulfide thin film may serve as a high mobility channel material in a logic device.

In some embodiment, the rhenium sulfide thin film has a thickness of less than about 10 nm, or even less than about 5 nm. In some embodiments the deposition cycle is repeated sequentially to form 20 molecular layers of $ReS_2$ or less, or 10 molecular layers of $ReS_2$ or less. In some embodiments less than about 3 molecular layers of $ReS_2$ are deposited.

In some embodiments, rhenium sulfide is deposited at a growth rate of from 0.2 to 1 angstrom/s.

BRIEF DESCRIPTION OF THE DRAWINGS

FIG. 20 provides the film thickness (EDX) and surface roughness (AFM) of the rhenium metal and rhenium nitride films deposited between 250° C. and 500° C.

FIG. 23 provides elemental composition, impurity content and stoichiometry of rhenium-containing films deposited between 250° C. and 500° C. as analyzed by TOF-ERDA.

FIG. 38 shows the GXIRD patterns of the rhenium sulfide films deposited as a function of deposition temperature 7.

FIG. 39 shows FSEM images of the films of the rhenium sulfide films deposited as a function of deposition temperature.

FIG. 40 shows the elemental composition, impurity content and stoichiometry of the rhenium sulfide films deposited between 120° C. and 500° C. as measured by TOF-ERDA.

FIG. 41 shows the elemental composition, impurity content and stoichiometry of the rhenium sulfide films deposited between 120° C. and 500° C. as measured by XPS.

DETAILED DESCRIPTION

Figure 1:
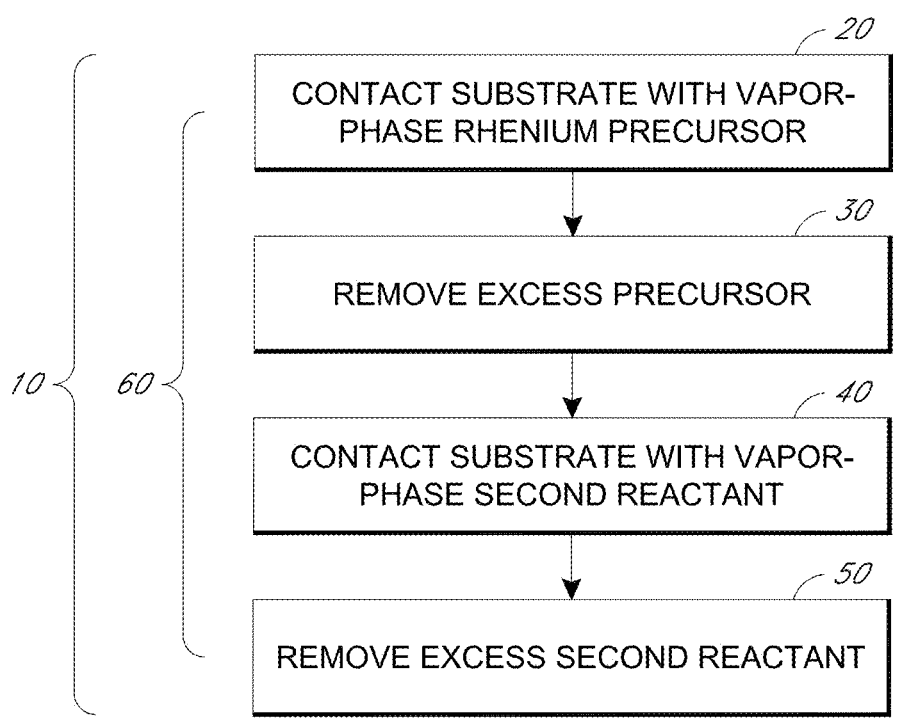
FIG. 1 is a process flow diagram generally illustrating processes for depositing a metallic rhenium film by ALD.

Rhenium-containing thin films can be deposited on a substrate by vapor phase deposition processes, such as atomic layer deposition—(ALD) and chemical vapor deposition (CVD)-type processes. In some embodiments a vapor deposition process can deposit a rhenium-containing material, for example metallic rhenium, rhenium nitride ($ReN_x$), rhenium sulfide, such as rhenium disulfide ($ReS_2$), rhenium oxide, or mixtures thereof. In some embodiments the rhenium-containing thin films may comprise rhenium nitride or a mixture of rhenium and $ReN_x$. In some embodiments the rhenium-containing thin films do not comprise rhenium nitride.

In some embodiments a deposition process uses a first vapor phase rhenium precursor as described herein in combination with a second vapor phase reactant as described herein. In some embodiments the second vapor phase reactant does not comprise oxygen. In some embodiments the second vapor phase reactant may comprise nitrogen, such as $NH_3$, or sulfur, such as $H_2S$.

In some embodiments vapor deposition processes comprise contacting the substrate with a vapor phase rhenium precursor, such as a rhenium halide, and one or more additional vapor phase reactants. For example, in some embodiments rhenium-containing thin films, such as metallic rhenium thin films, may be deposited by an ALD process comprising alternately and sequentially contacting a substrate with a vapor phase rhenium precursor, such as a rhenium halide and a second vapor phase reactant. In some embodiments the second reactant does not comprise oxygen. In some embodiments the second reactant may comprise nitrogen, such as $NH_3$. In some embodiments a rhenium metal film is deposited. In some embodiments rhenium nitride ($ReN_x$) or a mixture of Re and rhenium nitride may be deposited. In some embodiments rhenium sulfide films, such as rhenium disulfide films are deposited. Such films may be deposited, for example, by an ALD process comprising alternately and sequentially contacting a substrate with a vapor phase rhenium halide, such as $ReCl_5$ and a vapor phase sulfur-containing reactant, such as $H_2S$. In some embodiments a rhenium oxide film may be deposited.

Suitable substrate materials on which the rhenium-containing films may be deposited may include insulating materials, dielectric materials, conductive materials, metallic materials, crystalline materials, epitaxial, heteroepitaxial, and/or single crystal materials such as oxides. For example, the substrate may comprise $Al_2O_3$, sapphire, silicon, silicon oxide, or an insulating nitride, such as AlN. Further, the substrate material and/or substrate surface may be selected by the skilled artisan to enhance, increase, or maximize two-dimensional crystal growth thereon. In some embodiments the substrate surface on which the rhenium-containing thin film or material is to be deposited does not comprise a semiconductor material, such as Si, Ge, III-V compounds, for example GaAs and InGaAs, or II-VI compounds. In some embodiments the substrate surface on which the rhenium-containing thin film or material is to be deposited may comprise materials other than insulating materials or may consist only of materials other than insulating materials.

Vapor deposition processes for depositing the rhenium-containing films typically involve the sequential provision of two or more reactants, for example in an ALD- or CVD-type process. ALD type processes are based on controlled, typically self-limiting surface reactions of the precursor chemicals. Gas phase reactions are avoided by feeding the precursors alternately and sequentially into the reaction chamber. Vapor phase reactants are separated from each other in the reaction chamber, for example, by removing excess reactants and/or reactant by-products from the reaction chamber between reactant pulses. This may be accomplished with an evacuation step and/or with an inactive gas pulse or purge.

CVD type processes typically involve gas phase reactions between two or more reactants. The reactants can be provided simultaneously to the reaction space or substrate, or in partially or completely separated pulses. The substrate and/or reaction space can be heated to promote the reaction between the gaseous reactants. In some embodiments the reactants are provided until a thin film having a desired thickness is deposited. In some embodiments cyclical CVD type processes can be used with multiple cycles to deposit a thin film having a desired thickness. In cyclical CVD-type processes, the reactants may be provided to the reaction chamber in pulses that do not overlap, or that partially or completely overlap.

In some embodiments a deposition process for a rhenium-containing thin film has one or more steps which are not self-limiting. For example, in some embodiments at least one of the reactants is at least partially decomposed on the substrate surface. Thus, in some embodiments the process may operate in a process condition regime close to CVD conditions or in some cases fully in CVD conditions. In some embodiments a sequential or pulsed CVD process is utilized. In some embodiments a material comprising rhenium is deposited by a pulsed CVD process in which multiple pulses of a rhenium precursor and one or more additional reactants are separated by purge or removal steps in which reactant is removed from the substrate surface.

In some embodiments an ALD-process can be modified to be at least a partial CVD process. In some embodiments a partial CVD process can include at least partial decomposition of one or more precursors and/or at least partial overlap of two or more reactants. In some embodiments ALD processes can be modified to be a sequential or pulsed CVD process. A sequential or pulsed CVD process may utilize the same precursors and reaction conditions such as temperature and pressure as a corresponding ALD process.

In some embodiments an ALD process is modified to use overlapping or partially overlapping pulses of reactants. In some embodiments an ALD process is modified to use extremely short purge or removal times, such as below 0.1 s (depending on the reactor). In some embodiments an ALD process is modified to use extremely long or continuous pulse times. For example, in some embodiments an ALD process is modified to use no purge or removal at all after at least one reactant pulse. In some embodiments no purge is used after a rhenium precursor pulse. In some embodiments no purge is used after a second reactant pulse. In some embodiments no purge is used after either a rhenium precursor pulse or a second precursor pulse.

Briefly, the substrate on which a rhenium-containing film is to be deposited is loaded in a reaction chamber and is heated to a suitable deposition temperature, generally at lowered pressure. For ALD-type processes, deposition temperatures are maintained below the precursor thermal decomposition temperature but at a high enough level to avoid condensation of reactants and to provide the activation energy for the desired surface reactions. Of course, the appropriate temperature window for any given deposition process will depend upon a variety of factors including the surface on which the rhenium-containing film is deposited and the reactant species involved. In some embodiments the deposition temperature is below about 500° C. or below about 450° C., as discussed in more detail below.

In some embodiments, such as some CVD-type processes, the deposition temperature may be above the decomposition temperature of one or more of the reactants. In some embodiments the deposition temperature is above the decomposition temperature of the rhenium precursor but still low enough to maintain reasonably surface-controlled growth of a film. For example, in some such embodiments the growth rate of the rhenium-containing film is less than or equal to about a monolayer of material per deposition cycle. In some embodiments a deposition cycle growth rate may be less than or equal to about 50%, preferably less than about 25%, and more preferably less than about 10% of about a monolayer of material being deposited per cycle.

In some embodiments a rhenium precursor may be contacted with the substrate intermittently while a second precursor may flow continuously or substantially continuously through a reaction space throughout a deposition process. For example, the flow rate of a second precursor through a reaction space may be reduced while the substrate is contacted with a rhenium precursor. In some embodiments where a second precursor may flow continuously, the growth rate of the film per pulse of rhenium precursor is less than or equal to about one monolayer of the material being deposited. In some embodiments where the second precursor flows continuously, the growth rate per pulse of rhenium precursor is less than or equal to about 50%, preferably less than about 25%, and more preferably less than about 10% of a monolayer of the material being deposited.

In some embodiments of an ALD-type process, the surface of the substrate is contacted with a vapor phase first rhenium precursor. In some embodiments a pulse of vapor phase first rhenium precursor is provided to a reaction space containing the substrate. In some embodiments the substrate is moved to a reaction space containing vapor phase first rhenium precursor. Conditions are preferably selected such that no more than about one monolayer of species of the first rhenium precursor is adsorbed on the substrate surface in a self-limiting manner. The appropriate contacting times can be readily determined by the skilled artisan based on the particular circumstances. Excess first reactant and reaction byproducts, if any, are removed from the substrate surface, such as by purging with an inert gas or by removing the substrate from the presence of the first reactant.

Removing excess reactants can include evacuating some of the contents of a reaction space and/or purging a reaction space with helium, nitrogen or another inert gas. In some embodiments purging can comprise turning off the flow of the reactive gas while continuing to flow an inert carrier gas to the reaction space.

Purging means that vapor phase precursors and/or vapor phase byproducts are removed from the substrate surface such as by evacuating the reaction chamber with a vacuum pump and/or by replacing the gas inside a reaction chamber with an inert gas such as argon or nitrogen. Typical purging times are from about 0.05 to 20 seconds, and can be about 0.2 and 10, or between about 0.5 and 5 seconds. However, other purge times can be utilized if necessary, such as where highly conformal step coverage over extremely high aspect ratio structures or other structures with complex surface morphology is needed, or where different reactor types may be used, such as a batch reactor.

The surface of the substrate is subsequently contacted with a vapor phase second gaseous reactant. The second reactant reacts with the rhenium-containing species from the first reactant adsorbed on the substrate to form the rhenium-containing material.

In some embodiments a pulse of a second gaseous reactant is provided to a reaction space containing the substrate. The vapor phase second gaseous reactant may be provided into the reaction chamber in a substantially continuous flow from a reaction chamber inlet to an outlet. In some embodiments outlet flow from the reaction chamber, for example a pump line, is not closed. In some embodiments outlet flow from the reaction chamber, for example flow from a reaction chamber to a pump line and further through the pump line prior to the pump, is not substantially closed, but may be restricted. In some embodiments the substrate is moved to a reaction space containing the vapor phase second reactant. After a desired period of exposure the substrate may be moved from the space containing the reactant.

Excess second reactant and gaseous byproducts of the surface reaction, if any, are removed from the substrate surface. In some embodiments there is no dwell time for the reactants.

The steps of contacting and removing form a deposition cycle that is repeated until a rhenium containing thin film of the desired composition and thickness has been selectively formed on the substrate, with each cycle typically leaving no more than about a molecular monolayer of rhenium-containing material.

The steps of contacting and removing a first vapor phase rhenium precursor may be referred to as a first precursor phase, a rhenium precursor phase, or a rhenium phase. The steps of contacting and removing a second vapor phase reactant may be referred to as a second precursor phase or second reactant phase. Together, these two phases can make up a deposition cycle. Additional phases comprising alternately and sequentially contacting the surface of a substrate with other reactants can be included to form more complicated materials, such as ternary materials.

As mentioned above, each phase of each ALD cycle can be self-limiting. An excess of reactant precursors is supplied in each phase to saturate the susceptible structure surfaces. Surface saturation ensures reactant occupation of most or all available reactive sites (subject, for example, to physical size or "steric hindrance" restraints) and thus ensures excellent step coverage and uniformity. Typically, less than one molecular layer of material is deposited with each cycle, however, in some embodiments more than one molecular layer is deposited during each cycle.

The precursors employed in the deposition processes may be solid, liquid or gaseous materials under standard conditions (room temperature and atmospheric pressure), provided that the precursors are in vapor phase before they are contacted with the substrate surface. Contacting a substrate surface with a vaporized precursor means that the precursor vapor is in contact with the substrate surface for a limited period of time. Typically contacting times are from about 0.05 to 20 seconds, more preferably between about 0.2 and 10, and still more preferably between about 0.5 and 5 seconds. In some embodiments the contacting time is about 1 second. In some embodiments the vapor phase second reactant contacting time is preferably of the same order of magnitude as the vapor phase first gaseous reactant contacting time. In some embodiments the second reactant contacting time is less than about 60 seconds, preferably less than about 30 seconds, more preferably less than about 10 seconds and most preferably less than about 5 seconds. In some embodiments the vapor phase second gaseous reactant contacting time is preferably no more than about 100 times longer than the vapor phase first gaseous reactant contacting time.

However, depending on the substrate type and its surface area, the contacting time may be even higher than 20 seconds. Contacting times can be on the order of minutes or longer in some cases. The contacting time can be determined by the skilled artisan based on the particular circumstances.

The mass flow rate of the reactants can also be determined by the skilled artisan. In some embodiments the flow rate of a rhenium precursor is preferably between about 1 and 1000 sccm without limitation, or between about 100 and 500 sccm.

The pressure in a reaction chamber during the deposition of the rhenium-containing thin film is typically from about 0.01 to about 50 mbar, or from about 0.1 to about 10 mbar. However, in some cases the pressure will be higher or lower than this range, as can be determined by the skilled artisan given the particular circumstances.

Before starting the deposition of the film, the substrate is typically heated to a suitable deposition temperature. The deposition temperature varies depending on the type of thin film formed, physical properties of the precursors, etc. In some embodiments the deposition temperature is about 20° C. to about 1200° C., about 50° C. to about 800° C., or about 100° C. to about 600° C. In some embodiments the deposition temperature is greater than about 50° C., greater than about 100° C., greater than about 200° C., greater than about 300° C., greater than about 400° C., greater than about 500° C., or greater than about 600° C., but no greater than 1200° C. In some embodiments the deposition temperature is about 300° C. to about 500° C. In some embodiments the deposition temperature is about 300 to about 400° C. In some embodiments the deposition temperature is about 300° C. to about 450° C.

As mentioned above, in some embodiments each reaction is self-limiting and monolayer by monolayer growth is achieved. These may be referred to as "true ALD" reactions. In some such embodiments the rhenium precursor may adsorb on the substrate surface in a self-limiting manner. A second reactant in turn will react with the adsorbed rhenium precursor to form up to a monolayer of rhenium0containing material on the substrate.

However, in some embodiments ALD-type reactions are provided, in which there may be some precursor decomposition, but the growth saturates. That is, in some embodiments although a certain amount of film growth may be caused by thermal decomposition of the rhenium precursor at some deposition temperatures, saturated growth is preferably achieved when the second reactant is utilized. Such a reaction is an example of an ALD-type reaction. In such ALD-type reactions, films with good uniformity and relatively few impurities can be deposited.

In some embodiments thermal decomposition of one or more reactants occurs, such as the rhenium precursor. In such cases, the growth rate may not fully plateau with increasing reactant pulse times. Rather, the growth rate may continue to rise with increased pulse times, although the growth rate may increase more slowly with ever increasing pulse times. Thus in some embodiments a pulsed-CVD type deposition process is used, in which reactants are provided alternately and separately, but some gas-phase reactions may occur. Preferably the conditions are selected such that surface controlled decomposition is the mechanism for decomposition, which leads to good uniformity and good step coverage. Reaction conditions can also be selected such that good control of the reactions is maintained, leading to good quality films with low impurities.

Thus, in some embodiments the deposition temperature is below the thermal decomposition temperature of the rhenium precursor (or other reactant as described herein) while in other embodiments the deposition temperature may be at or above the thermal decomposition temperature.

As mentioned above, in some embodiments a thin rhenium-containing film is deposited on a substrate surface by a pulsed-CVD process in which a vapor phase rhenium precursor is intermittently pulsed into a reaction space comprising the substrate and purged from the reaction space. The substrate may be contacted with a second vapor phase precursor, for example in a sequential pulse. The pulses of the rhenium precursor and second precursor may at least partially overlap.

In some embodiments the deposited rhenium-containing thin film may be subjected to optional post deposition treatment process. In some embodiments, for example, a post deposition treatment process may comprise an annealing process, for example a forming gas annealing process. In some embodiments a post deposition treatment process may comprise exposing the rhenium-containing thin film to a plasma. In some other embodiments a post deposition treatment process does not comprise exposing the rhenium-containing thin film to a plasma.

The processing time depends on the thickness of the layer to be produced and the growth rate of the film. In ALD type processes, the growth rate of a thin film is determined as thickness increase per one cycle. One cycle consists of the pulsing and purging steps of the precursors and the duration of one cycle is typically between about 0.2 and 30 seconds, more preferably between about 1 and 10 seconds, but it can be on order of minutes or more in some cases.

In some embodiments the deposition process is repeated to deposit a rhenium containing film having a thickness of less than about 10 molecular layers. In some embodiments the deposition process is repeated to deposit a rhenium containing film having a thickness of less than about 5 molecular layers. In some embodiments the deposition process is repeated to deposit a rhenium containing film having a thickness of less than about 3 molecular layers.

In some embodiments a rhenium-containing film is deposited to have a thickness of less than about 10 nm, or less than about 5 nm.

Examples of suitable reactors that may be used for the deposition of rhenium-containing thin films include commercially available ALD equipment such as the F-120® reactor, Pulsar® reactor and EmerALD™ reactor, available from ASM America, Inc of Phoenix, Ariz. In addition to these ALD reactors, many other kinds of reactors capable of deposition of thin films, including CVD reactors equipped with appropriate equipment and means for pulsing the precursors, can be employed for carrying out various embodiments disclosed herein. Preferably, reactants are kept separate until reaching the reaction chamber, such that shared lines for the precursors are minimized.

In some embodiments a suitable reactor may be a batch reactor and may contain more than about 25 substrates, more than about 50 substrates or more than about 100 substrates. In some embodiments a suitable reactor may be a mini-batch reactor and may contain from about 2 to about 20 substrates, from about 3 to about 15 substrates or from about 4 to about 10 substrates.

The growth processes can optionally be carried out in a reactor or reaction space connected to a cluster tool. In a cluster tool, because each reaction space is dedicated to one type of process, the temperature of the reaction space in each module can be kept constant, which clearly improves the throughput compared to a reactor in which is the substrate is heated up to the process temperature before each run.

Deposition of Thin Films Comprising Rhenium

As discussed above, thin films formed of rhenium-containing materials may be deposited by vapor deposition processes in which the substrate is contacted with a rhenium reactant and a second reactant. In some embodiments the substrate is sequentially contacted with the reactants, such as in an ALD or pulsed-CVD process. The reactants and reaction conditions can be selected to deposit metallic rhenium, rhenium oxide, rhenium nitride, rhenium sulfide and mixtures thereof. As discussed in more detail below, in some embodiments metallic rhenium, rhenium nitride and mixtures thereof can be deposited using a rhenium precursor and a nitrogen reactant. In some embodiments rhenium sulfide thin films can be deposited using a rhenium precursor and a sulfur reactant.

More generally, according to some embodiments, and illustrated in FIG. 1, a rhenium-containing thin film is formed on a substrate by an ALD-type process comprising at least one deposition cycle 10 the deposition cycle comprising:

contacting the surface of a substrate with a vaporized rhenium precursor at step 20 to form at most a molecular monolayer of rhenium-containing species on the substrate;

removing excess rhenium precursor and reaction by products, if any, from the surface at step 30;

contacting the surface of the substrate with a vaporized second reactant at step 40, such that the second reactant reacts with the rhenium-containing species on the substrate surface to form a rhenium-containing material; and removing from the surface excess second reactant and any gaseous by-products formed in the reaction between the rhenium species and the second reactant at step 50.

The contacting and removing steps can be repeated 60 until a rhenium-containing thin film of the desired thickness has been formed.

Although the illustrated deposition cycle begins with contacting the surface of the substrate with the rhenium precursor, in other embodiments the deposition cycle may begin with contacting the surface of the substrate with the second reactant. It will be understood by the skilled artisan that if the surface of the substrate is contacted with a first reactant and that reactant does not react then the process will effectively begin when the next reactant is provided.

In some embodiments, the reactants and reaction by-products can be removed from the substrate surface by stopping the flow of the reactant while continuing the flow of an inert carrier gas such as nitrogen or argon. However, in some embodiments the substrate is moved such that different reactants alternately and sequentially contact the surface of the substrate in a desired sequence for a desired time. In some embodiments the removing steps are not performed. In some embodiments no reactant is removed from the various parts of a reaction chamber. In some embodiments the substrate is moved from a part of a reactor or reaction chamber containing a first reactant or precursor to another part of the reactor or reaction chamber containing the second reactant. In some embodiments the substrate is moved from a first reaction chamber containing a first reactant to a second, different reaction chamber containing a second reactant.

In some embodiments the rhenium-containing film may contain one or more impurities, such as C, H, O or Cl. In some embodiments the film may contain less than about 3 at-% carbon, preferably less than about 2 at-% carbon, and most preferably less than about 1 at-% carbon. In some embodiments the film may contain 0.5 at-% carbon or less, 0.3 at-% carbon or less or even 0.1 at-% carbon or less. In some embodiments the film may contain less than about 12 at-% hydrogen, less than about 3 at-% hydrogen, preferably less than about 2 at-% hydrogen, and most preferably less than about 1 at-% hydrogen. In some embodiments the film may contain about 0.6 at-% hydrogen or less, about 0.4 at-% hydrogen or less, about 0.3 at-% hydrogen or less, or about 0.2 at-% hydrogen or less. In some embodiments the film may contain less than about 60 at-% oxygen, less than about 20 at-% oxygen, less than about 10 at-% oxygen, or less than about 5 at-% oxygen. In some embodiments the film may contain 2 at-% or less oxygen, 1 at-% or less oxygen, 0.6 at-% or less oxygen, or 0.2 at-% or less oxygen. In some embodiments the film may contain less than about 20 at-% Cl, less than about 10 at-% Cl, less than about 5 at-% Cl, less than about 2 at-% Cl, or less than about 1 at-% Cl. In some embodiments the film may contain about 0.6 at-% Cl or less, or about 0.3 at-% Cl or less. It is to be noted that a rhenium containing film containing the above described impurities may still be suitable for different applications, such as for a 2D-material.

Suitable rhenium precursors may be selected by the skilled artisan. In some embodiments the rhenium precursor is a rhenium halide. In some embodiments the rhenium halide comprises chloride. In some embodiments the rhenium precursor is $ReCl_5$. In some embodiments the rhenium precursor comprises chlorine or a chloride ligand. In some embodiments the rhenium precursor is a rhenium fluoride, such as $ReF_6$. In some embodiments the rhenium precursor is a rhenium bromide. In some embodiments the rhenium precursor is a rhenium iodide.

As mentioned above, the rhenium precursor employed in the deposition processes may be solid, liquid or gaseous material, provided that the rhenium precursor is in vapor phase before it is conducted into the reaction chamber and contacted with the substrate surface.

It will be understood by one skilled in the art that any number of second reactants may be used in the vapor deposition processes disclosed herein, depending on the desired rhenium-containing film to be deposited. In some embodiments the second reactant comprises at least one hydrogen atom. In some embodiments a second reactant may be a nitrogen precursor, or nitrogen containing reactant, such as $NH_3$. In some embodiments a second reactant may be a sulfur reactant, such as $H_2S$. In some embodiments the second reactant does not comprise oxygen. In some embodiments the second reactant does not significantly contribute material to the deposited material or the final formed film. In some embodiments the second reactant does contribute material to the rhenium-containing film. For example, the nitrogen reactant may contribute nitrogen to a rhenium nitride film or a film comprising rhenium and rhenium nitride. Similarly, a sulfur reactant may contribute sulfur to a rhenium sulfide film.

In some embodiments a nitrogen reactant may comprise nitrogen and at least one hydrogen. In some embodiments a nitrogen reactant may comprise, for example, $N_2$, $NO_2$, $NH_3$, $N_2H_4$ and/or other nitrogen containing compounds.

In some embodiments, a sulfur reactant is utilized. In some embodiments a sulfur reactant may be, for example, $H_2S$, an alkylsulfur compound such as $(CH_3)_2S$, $(NH_4)_2S$, dimethylsulfoxide $((CH_3)_2SO)$, elemental or atomic S, or $H_2S_2$ or other reactants with the formula R—S—H, wherein R can be a substituted or unsubstituted hydrocarbon, preferably a C1-C8 alkyl or substituted alkyl, such as an alkylsilyl group, more preferably a linear or branched C1-C5 alkyl group. In some embodiments, a sulfur precursor comprises $H_2S_n$, wherein n is from 4 to 10.

In some embodiments the process may be a thermal process that does not utilize any plasma reactants. In some embodiments the process may utilize a plasma. For example, nitrogen, hydrogen, sulfur or oxygen containing plasma, radicals, excited species or atoms may be used in a plasma process. Plasmas may comprise a noble gas such as Ar or He, or combinations of two or more noble gases. Plasmas may also comprise mixtures thereof, such as nitrogen and hydrogen containing plasma as well as noble gas. For example, in some embodiments the plasma may be generated in a mixture of N, H and noble gas.

2D Materials

The vapor deposition processes described herein may be used to deposit 2D materials comprising rhenium, for example $ReS_2$ 2D materials. 2D materials, also referred to as single layer materials, are materials that consist of a single connected molecular monolayer. While 2D materials form a single connected molecular monolayer, multiple monolayers may be deposited by the deposition processes disclosed herein. For example, in the case of 2D $ReS_2$, the 2D material comprises a single layer of covalently bonded $ReS_2$ molecules, arranged so that one layer of Re atoms is sandwiched between two layers of S atoms. However, $ReS_2$ can act as a 2D layer with thicker layers as well. Thus, as mentioned above, multiple monolayers may be deposited to form the 2D material.

Due to their unusual characteristics, 2D rhenium-containing materials are useful in a wide variety of applications, for example as lubrication, in optoelectronics, spintronics and valleytronics, in THz generation and detection, for use as catalysts, chemical and biological sensors, supercapacitors, LEDs, solar cells, Li-ion batteries, and as MOSFET channel materials.

2D rhenium-containing thin films deposited by the methods disclosed herein possess electronic properties that make them useful for semiconductor device miniaturization. For example, 2D rhenium sulfide films have a direct band gap and can be used as a channel material in a gate stack or transistors.

According to some embodiments a 2D material comprising rhenium can be deposited by vapor deposition according to the methods disclosed herein. In some embodiments a 2D material comprising rhenium may comprise less than or equal to ten molecular monolayers of a compound comprising rhenium, less than or equal to five molecular monolayers, or less than or equal to three molecular monolayers.

In some embodiments a method for depositing a 2D material comprising rhenium on a substrate may comprise a deposition process as disclosed herein comprising at least one but less than or equal to 1000 depositions cycles, less than or equal to 500 deposition cycles, less than or equal to 200 deposition cycles, or less than or equal to 100 deposition cycles.

As can be selected by the skilled artisan depending on the particular precursors, substrate and process conditions, a method for depositing a 2D material comprising rhenium on a substrate may comprise an ALD process as disclosed herein comprising at least one but less than or equal to 1000 depositions cycles, less than or equal to 500 deposition cycles, less than or equal to 200 deposition cycles, or less than or equal to 100 deposition cycles, less than or equal to 50 cycles, less than or equal to 25 cycles, less than or equal to 15 cycles, or less than or equal to 10 cycles. In some embodiments the ALD cycle comprises alternately and sequentially contacting the substrate with a rhenium precursor and a second reactant as described herein.

In some embodiments the deposited 2D material comprising rhenium may be 100 nm or less, 50 nm or less, 25 nm or less, 10 nm or less, 5 nm or less, 3 nm or less, 2 nm or less, 1.5 nm or less, or 1.0 nm or less, down to a single molecular layer or even a partial molecular layer.

Metallic Rhenium Thin Films

According to some embodiments, a metallic rhenium thin film is deposited on a surface of a substrate by a vapor deposition process comprising one or more deposition cycles in which a substrate is sequentially contacted with a vapor-phase rhenium precursor and a vapor phase second reactant. In some embodiments the vapor deposition process may be a cyclical deposition process in which the substrate is repeatedly contacted with two or more vapor phase reactants, for example, an atomic layer deposition (ALD) process, a sequential chemical vapor deposition (CVD) process or a pulsed CVD process. In some embodiments a deposition cycle is repeated two or more times to form a metallic rhenium film of a desired thickness.

In some embodiments the vapor deposition process is an ALD-type process in which a substrate is alternately and sequentially contacted with a vapor-phase rhenium precursor and a vapor phase second reactant. In some embodiments an ALD process comprises one or more deposition cycles, each cycle comprising: pulsing a vaporized rhenium precursor into a reaction chamber where it contacts a substrate and forms up to a molecular layer of rhenium precursor species on a first surface of the substrate, removing excess rhenium precursor and reaction by products, if any, from the reaction chamber; providing a pulse of a second reactant, such as ammonia containing gas into the reaction chamber to contact the first surface of the substrate, wherein the second reactant reacts with the rhenium species on the surface to form a metallic rhenium material, removing excess second reactant and any gaseous by-products formed in the reaction between the rhenium precursor species on the first surface of the substrate and the second reactant, and repeating the deposition cycle until a metallic rhenium thin film of the desired thickness has been formed. In some embodiments the deposition cycle is repeated two or more times.

In some embodiments the metallic rhenium film is elemental rhenium. In such embodiments the metallic rhenium thin film typically comprises multiple monolayers of elemental rhenium. However, in other embodiments, the thin film may comprise rhenium compounds or alloys comprising rhenium and one or more different metals. In some embodiments the additional materials may be provided by contacting the substrate with one or more additional reactants.

The rhenium precursor may be as described above. In some embodiments the rhenium precursor may comprise rhenium and a halogen. The rhenium-containing precursor may be a rhenium halide precursor. In some embodiments, the rhenium precursor may comprise rhenium and one or more halide, such as chloride ligands. In some embodiments the rhenium reactant may comprise one or more Re—Cl bonds. For example, in some embodiments the rhenium precursor may be $ReCl_5$. In some embodiments the rhenium precursor may be a rhenium fluoride, such as $ReF_6$, a rhenium bromide or a rhenium iodide.

The second reactant is one that is able to react with the rhenium species on the substrate to form the desired metallic rhenium material under the selected deposition conditions. In some embodiments the second reactant may be a nitrogen precursor, or nitrogen containing reactant. In some embodiments the second reactant may not significantly contribute material to the final formed film. In some embodiments the second reactant does contribute material to the rhenium-containing film.

In some embodiments the second reactant is a nitrogen precursor as described above, for example, $N_2H_4$, $N_2$, $NO_2$, $NH_3$, and/or other nitrogen containing compounds. However, in some embodiments the metallic rhenium thin film is not a rhenium nitride thin film.

In some embodiments the second reactant comprises hydrogen species. In some embodiments the second reactant comprises one or more reactive species formed by generating a plasma in a reactant gas, as described above. For example, the plasma may be generated in $H_2$, or a gas mixture comprising a noble gas. In some embodiments the second reactant does not comprise molecular hydrogen in the absence of the formation of a plasma.

In some embodiments a film comprising rhenium, such as a metallic film comprising rhenium, is deposited at a deposition temperature of less than about 450° C. In some embodiments the deposition temperature is about 120° C. to about 500° C., or about 250° C. to about 500° C. In some embodiments the deposition temperature is about 20° C. to about 1200° C., about 50° C. to about 800° C., or about 100° C. to about 600° C. In some embodiments the deposition temperature is greater than about 50° C., greater than about 100° C., greater than about 200° C., greater than about 300° C., greater than about 400° C., greater than about 500° C., or greater than about 600° C., but no greater than 1200° C. In some embodiments the deposition temperature is about 300° C. to about 500° C. In some embodiments the deposition temperature is about 300 to about 400° C. In some embodiments the deposition temperature is about 300° C. to about 450° C.

In some embodiments a metallic rhenium thin film is deposited at a growth rate of about 0.01 Å/cycle to about 5 Å/cycle, from about 0.1 Å/cycle to about 2 Å/cycle, or about 0.2 Å/cycle to about 0.4 Å/cycle. In some embodiments a metallic rhenium thin film is deposited at a growth rate of more than about 0.01 Å/cycle, 0.05 Å/cycle, 0.1 Å/cycle, 0.2 Å/cycle, or 0.4 Å/cycle.

In some embodiments a method for depositing a metallic rhenium film on a substrate may comprise from 1 to 1000 depositions cycles, from 1 to 500 deposition cycles, from 1 to 200 deposition cycles, from 1 to 100 deposition cycles, from 1 to 50 cycles, from 1 to 25 cycles, from 1 to 15 cycles, or from 1 to 10 cycles. In some embodiments the ALD cycle comprises alternately and sequentially contacting the substrate with a rhenium precursor and a second reactant as described above.

In some embodiments the metallic rhenium film may have a thickness of 100 nm or less, 50 nm or less, 25 nm or less, 10 nm or less, 5 nm or less, 3 nm or less, 2 nm or less, 1.5 nm or less, or 1.0 nm or less, down to a single molecular layer or even a partial molecular layer.

The metallic rhenium thin films may be deposited on a three-dimensional structure. In some embodiments the step coverage of the rhenium thin film may be equal to or greater than about 50, about 80, about 90, about 95, about 98 or about 99%.

In some embodiments a metallic rhenium film may comprise one or more impurities, such as Cl, H, O and C. In some embodiments the film may contain less than about 3 at-% carbon, preferably less than about 2 at-% carbon, and most preferably less than about 1 at-% carbon. In some embodiments the film may contain 0.5 at-% carbon or less, 0.3 at-% carbon or less or even 0.1 at-% carbon or less.

In some embodiments the film may contain less than about 20 at-% hydrogen, preferably less than about 10 at-% hydrogen, and most preferably less than about 5 at-% hydrogen. In some embodiments the film may contain less than about 12 at-% hydrogen, less than about 3 at-% hydrogen, preferably less than about 2 at-% hydrogen, and most preferably less than about 1 at-% hydrogen. In some embodiments the film may contain about 0.6 at-% hydrogen or less, about 0.4 at-% hydrogen or less, about 0.3 at-% hydrogen or less, or about 0.2 at-% hydrogen or less.

In some embodiments the film may contain less than about 60 at-% oxygen, less than about 20 at-% oxygen, less than about 10 at-% oxygen, or less than about 5 at-% oxygen. In some embodiments the film may contain 2 at-% or less oxygen, 1 at-% or less oxygen, 0.6 at-% or less oxygen, or 0.2 at-% or less oxygen.

In some embodiments the film may contain less than about 20 at-% Cl, less than about 10 at-% Cl, less than about 5 at-% Cl, less than about 2 at-% Cl, or less than about 1 at-% Cl. In some embodiments the film may contain about 0.6 at-% Cl or less, or about 0.3 at-% Cl or less.

In some embodiments the elemental N:Re ratio is from about 0.01 to about 1, or from about 0.01 to about 0.6.

In some embodiments a metallic rhenium film has a resistivity of about 10 to about 500 microOhmcm, or about 15 to about 200 microOhmcm. In some embodiments a metallic rhenium film has a resistivity of less than about 1000 microOhmcm, less than about 500 microOhmcm, less than about 200 microOhmcm, less than about 100 microOhmcm, less than about 50 microOhmcm, less than about 30 microOhmcm or less than about 25 microOhmcm.

In some embodiments a metallic rhenium thin film can serve as a work function-setting layer in a gate stack. In some embodiments the metallic rhenium thin film can serve as a copper capping layer. In some embodiments the metallic rhenium thin film can serve as a contact metal layer.

Rhesium Sulfide Thin Films

In some embodiments a rhenium sulfide thin film, such as a rhenium disulfide thin film, is deposited on a substrate by a vapor deposition process. The rhenium sulfide may be a two-dimensional material. In some embodiments the vapor deposition process may be a cyclical deposition process in which the substrate is repeatedly contacted with two or more vapor phase reactants, for example, an atomic layer deposition (ALD) process, a sequential chemical vapor deposition (CVD) process or a pulsed CVD process.

The deposition process is continued until a rhenium sulfide film of a desired thickness is deposited. The actual thickness may be selected depending on the particular circumstances. In some embodiments, a rhenium sulfide film is deposited to a thickness of less than about 10 nm or less than about 5 nm. In some embodiments the rhenium sulfide film may have a thickness of 10 nm or less, 5 nm or less, 3 nm or less, 2 nm or less, 1.5 nm or less, or 1.0 nm or less, down to a single molecular layer or even a partial molecular layer.

In some embodiments the deposition processes allows for deposition of very thin rhenium sulfide layers. In some embodiments $ReS_2$ is deposited to a thickness of less than bout 20 molecular layers, less than about 10 molecular layers, less than about 5 molecular layers or less than about 3 molecular layers, down to a partial molecular layer.

In some embodiments a method for depositing a rhenium sulfide film on a substrate may comprise from 1 to 1000 depositions cycles, from 1 to 500 deposition cycles, from 1 to 200 deposition cycles, from 1 to 100 deposition cycles, from 1 to 50 cycles, from 1 to 25 cycles, from 1 to 15 cycles, or from 1 to 10 cycles. In some embodiments the ALD cycle comprises alternately and sequentially contacting the substrate with a rhenium precursor and a sulfur reactant as described above.

The rhenium sulfide thin films may be deposited on a three-dimensional structure. In some embodiments the step coverage of the rhenium thin film may be equal to or greater than about 50, about 80, about 90, about 95, about 98 or about 99%.

In some embodiments a substrate is contacted with a rhenium-containing reactant and a sulfur-containing reactant to deposit a rhenium sulfide film. In some embodiments a rhenium disulfide ($ReS_2$) thin film is deposited.

In some embodiments the sulfur-containing reactant may comprise elemental sulfur.

Figure 2:
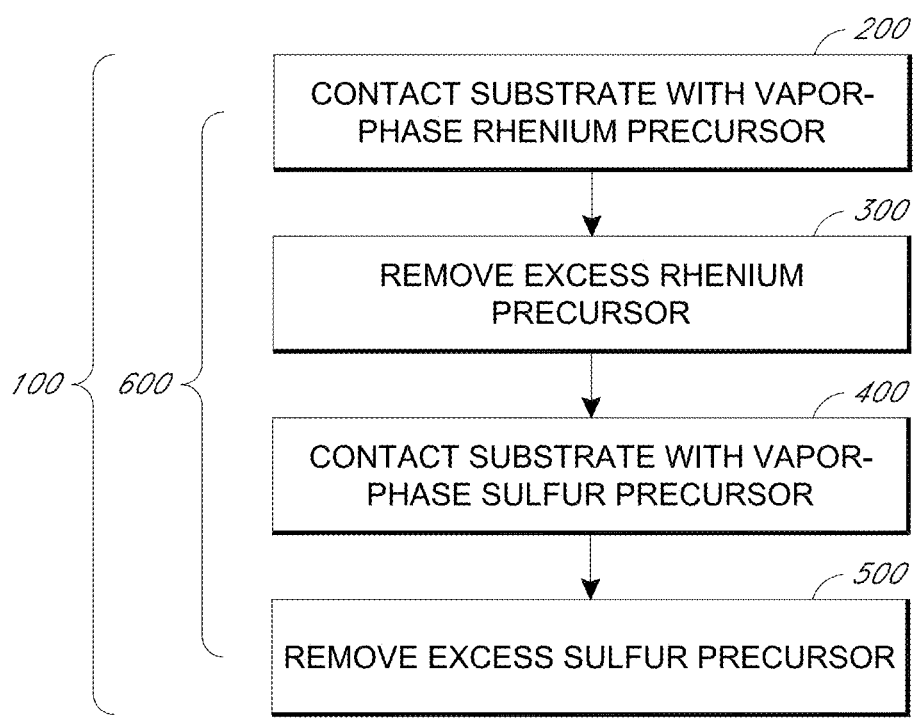
FIG. 2 is a process flow diagram generally illustrating processes for depositing rhenium disulfide films by ALD.

In some embodiments the vapor deposition process is an ALD-type process in which a substrate is alternately and sequentially contacted with a vapor-phase rhenium precursor and a vapor phase second reactant. As illustrated in FIG. 2, in some embodiments an ALD process comprises one or more deposition cycles 100, each cycle comprising: contacting a substrate in a reaction chamber with a vaporized rhenium precursor 200 to form a molecular layer of rhenium precursor species on a first surface of the substrate, removing excess rhenium precursor and reaction by products 300, if any, contacting the substrate surface with a second, sulfur-containing reactant 400, such as $H_2S$, whereby the second reactant reacts with the rhenium precursor species on the substrate surface to form rhenium disulfide; removing excess second reactant and any gaseous by-products formed in the reaction between the rhenium precursor species on the surface of the substrate and the second reactant 500, and repeating the cycle 600 until a rhenium disulfide thin film of the desired thickness has been formed.

As mentioned above, the substrate can comprise various types of materials. In some embodiments the substrate may comprises a number of thin films with varying chemical and physical properties. Further, the substrate surface may have been patterned and may comprise structures such as nodes, vias and trenches.

In some embodiments the rhenium precursor may comprise rhenium and a halide, as described above. The rhenium-containing reactant may be a rhenium halide precursor. In some embodiments, the rhenium reactant may comprise rhenium and one or more chloride ligands. In some embodiments the rhenium reactant may comprise one or more Re—Cl bonds. For example, in some embodiments the rhenium precursor may comprise $ReCl_5$. In some embodiments the rhenium precursor may comprise a rhenium fluoride, such as $ReF_6$, a rhenium bromide or a rhenium iodide.

In some embodiments the sulfur-containing reactant may comprise hydrogen and sulfur, as described above. In some embodiments the sulfur-containing reactant may comprise an H—S bond. In some embodiments the sulfur-containing reactant may be $H_2S$.

In some embodiments a film comprising rhenium, such a rhenium sulfide, is deposited at a deposition temperature of less than about 400° C. In some embodiments the deposition temperature is about 100° C. to about 500° C., or about 120° C. to about 500° C. In some embodiments the deposition temperature is about 150° C. to about 350° C. In some embodiments the deposition temperature is about 200 to about 350° C. In some embodiments the deposition temperature is about 200° C. to about 300° C. In some embodiments the deposition temperature is from about 20° C. to about 1000° C., from about 50 to about 750 C. In some embodiments the deposition temperature is less than about 1000 C, less than about 750 C, less than about 600 C, less than about 500 C.

In some embodiments films comprising rhenium are deposited at a growth rate of about 0.2 to about 1.0 A cycle-1. In some embodiments a thin film comprising rhenium is deposited at a growth rate of about 0.01 Å/cycle to about 5 Å/cycle, from about 0.1 Å/cycle to about 2 Å/cycle, or from about 0.2 Å/cycle to about 0.4 Å/cycle. In some embodiments a thin film comprising rhenium is deposited at a growth rate of more than about 0.01 Å/cycle, 0.05 Å/cycle, 0.1 Å/cycle, 0.2 Å/cycle, or 0.4 Å/cycle.

In some embodiments a rhenium sulfide thin film is deposited at a growth rate of about 0.2 to about 1.0 A cycle-1. In some embodiments the rhenium sulfide thin film is deposited at a growth rate of about 0.01 Å/cycle to about 5 Å/cycle, from about 0.1 Å/cycle to about 2 Å/cycle, or from about 0.2 Å/cycle to about 0.4 Å/cycle. In some embodiments a rhenium sulfide thin film is deposited at a growth rate of more than about 0.01 Å/cycle, 0.05 Å/cycle, 0.1 Å/cycle, 0.2 Å/cycle, or 0.4 Å/cycle.

In some embodiments a rhenium sulfide film may comprise one or more impurities, such as Cl, H, O and C. In some embodiments the film may contain less than about 3 at-% carbon, preferably less than about 2 at-% carbon, and most preferably less than about 1 at-% carbon. In some embodiments the film may contain less than about 20 at-% hydrogen, preferably less than about 10 at-% hydrogen, and most preferably less than about 5 at-% hydrogen. In some embodiments the film may contain less than about 20 at-% oxygen, less than about 10 at-% oxygen, or less than about 5 at-% oxygen. In some embodiments the film may contain less than about 10 at-% Cl, less than about 5 at-% Cl or less than about 2 at-% Cl.

In some embodiments the elemental S:Re ratio is from about 0.5 to about 3, from about 1 to about 2.5, from about 1.5 to about 2.3, from about 1.8 to about 2.2 or from about 1.9 to about 2.1. In some embodiments the elemental S:Re ratio is from about 0.8 to about 1.9.

In some embodiments the rhenium sulfide thin film can find use in integrated circuits, semiconductor devices or optical devices. In some embodiments the rhenium sulfide film is used as a channel material in an integrated circuit device, for example as a high mobility channel material in a logic device. In some embodiments a 2D material is used in applications where ultrathin, continuous and possibly pin-hole free tin films are utilized, such as in applications where electrically conductive or semiconducting thin films are desired.

EXAMPLES

Thin rhenium-containing films were grown in a commercial cross-flow F-120 ALD reactor (ASM Microchemistry Ltd., Finland) under a nitrogen pressure of about 10 mbar. Nitrogen gas was provided from a liquid nitrogen tank and used as a carrier and a purging gas. In some experiments deposition was on 5×5 cm2 substrates of Si(100) with native oxide on top or 5×5 cm2 substrates of soda lime glass. In some embodiments deposition was on Al2O3 films.

Crystal structures of the films were identified from X-ray diffraction (XRD) patterns measured with a PANalytical X'Pert Pro X-ray diffractometer in grazing incidence mode (GIXRD). Surface morphology of the films was examined by a Hitachi S-4800 field emission scanning electron microscope (FESEM). Film thicknesses were determined from energy-dispersive X-ray spectroscopy (EDX) data measured using an Oxford INCA 350 microanalysis system connected to the FESEM. The EDX results were analyzed using a GMR electron probe thin film microanalysis program.

In some experiments, 20 nm thick rhenium metal films were grown at 400° C. on in-situ grown $Al_2O_3$ at a growth rate of 0.2 Å/cycle. The films had a resistivity of about 24 μΩcm.

Metallic Rhenium and Rhenium Nitride Deposition

Deposition of metallic rhenium was carried out using $ReCl_5$ and $NH_3$ as precursors. $ReCl_5$ (99.9%-Re, Strem) was sublimed from an open boat held inside the reactor at 110° C. and pulsed into the reaction chamber using inert gas valving. The flow rates of $H_2S$ (99.5%, Linde) and $NH_3$ (99.9999%, Linde) were set to 10 sccm during continuous flows via mass flow meters and needle valves. All of the precursor pulse lengths were 2 s each while the purges were 1-2 s each.

Figure 3:
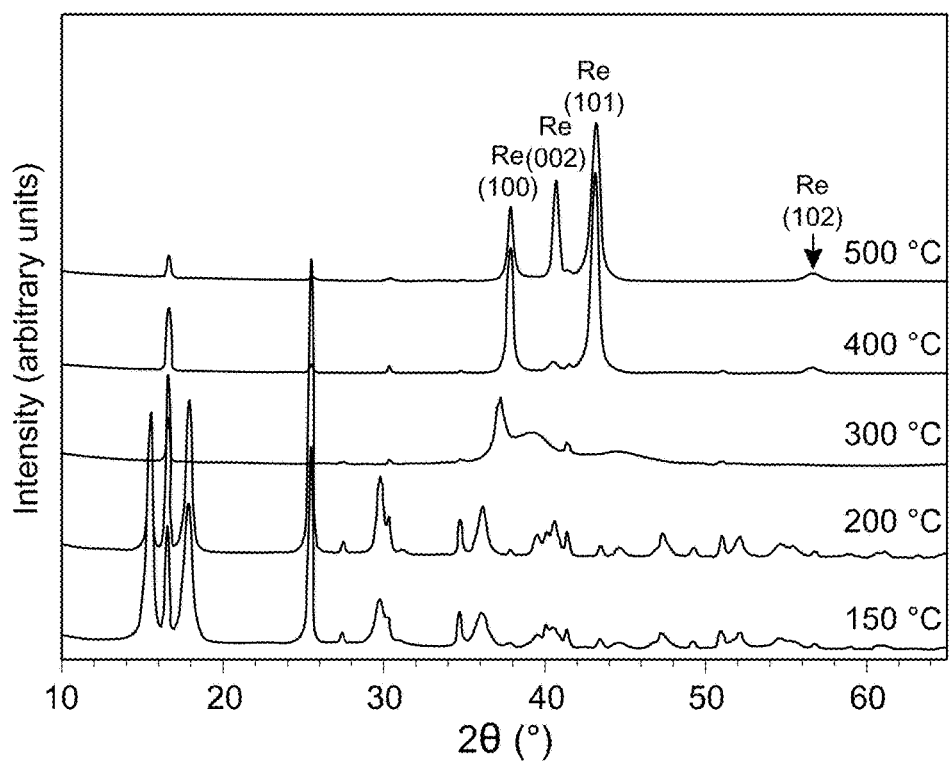
FIG. 3 shows GIXRD patterns of metallic rhenium films grown at deposition temperatures between 150 and 500° C. on Si substrates. A total of 1000 cycles were applied.
Figure 4:
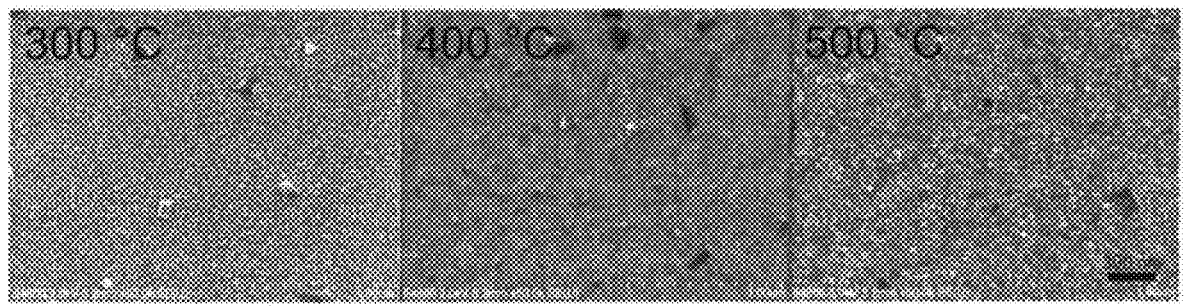
FIG. 4 shows FESEM images of metallic rhenium films grown at deposition temperatures between 300 and 500° C. on Si substrates. A total of 1000 cycles were applied.
Figure 5:
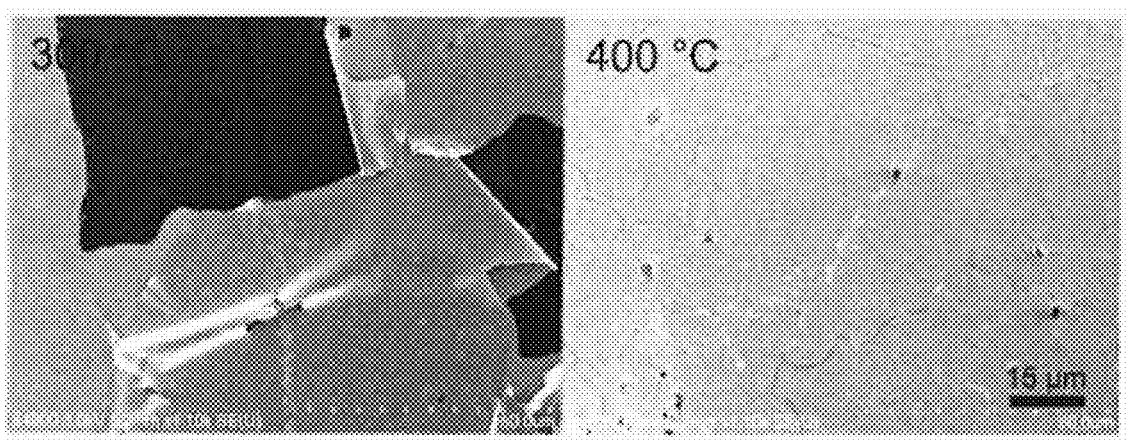
FIG. 5 shows FESEM images of metallic rhenium films grown at deposition temperatures between 300 and 400° C. on Si substrates. A total of 100 cycles were applied.

FIG. 3 presents the GIXRD patterns obtained from deposition on Si substrates at deposition temperatures between 150 and 500° C. The films deposited at between 300 and 500° C. were metallic in appearance, while deposition on substrates at lower deposition temperatures was non-uniform and dark in color. The films grown at 400 and 500° C. were identified to be metallic Re as shown in FIG. 3. In addition, some unidentifiable peaks were visible in the patterns at lower angles. Also in FESEM images some larger grains could be seen (FIG. 4), which may have been related to these unidentified peaks. The films deposited at deposition temperatures of 300 and 400° C. revealed that part of the films were either delaminated from the Si surface (300° C.) or showed cracking patterns (400° C.) (FIG. 5).

Figure 6:
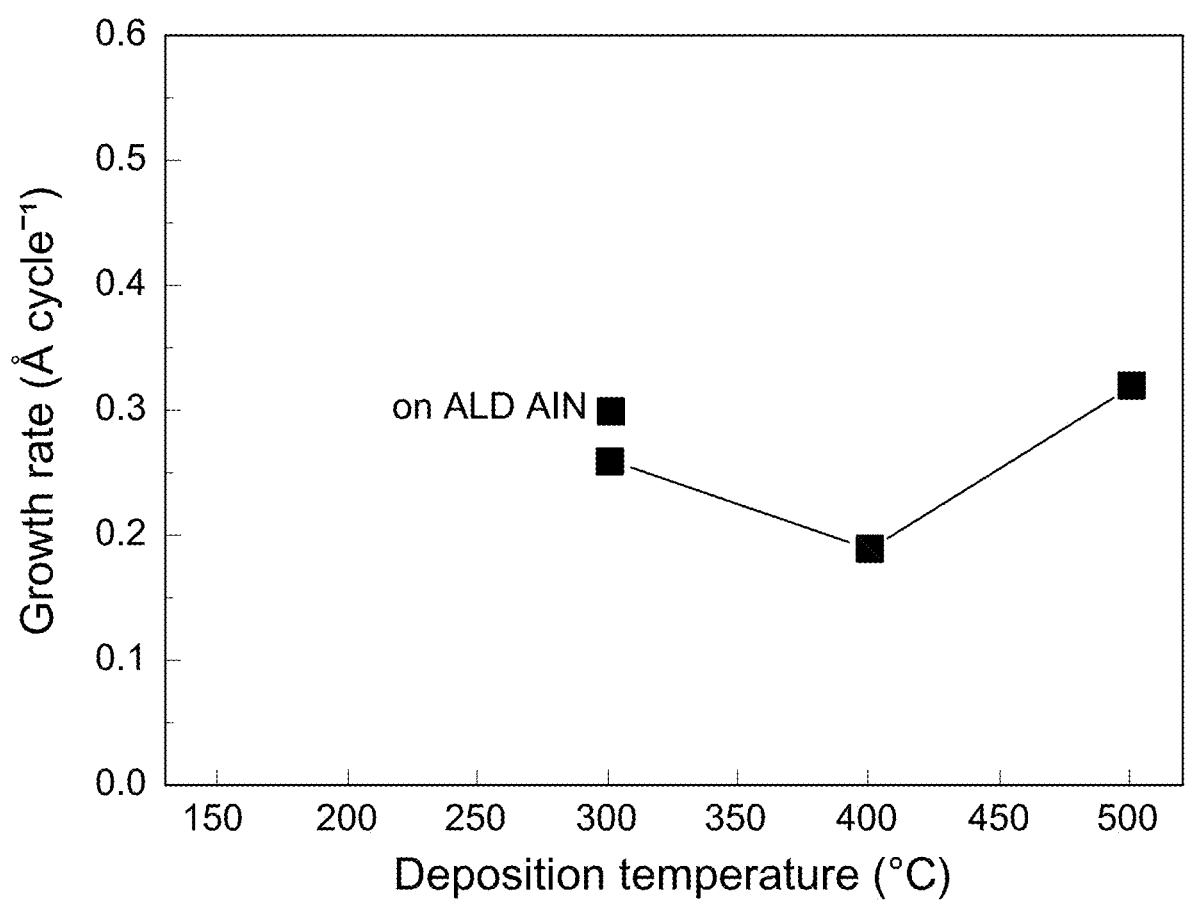
FIG. 6 illustrates growth rates of rhenium films as a function of deposition temperature. 1000 cycles were applied in each deposition.

The growth rates of the rhenium films at various deposition temperatures are shown in FIG. 6. The growth rates were about 0.2-0.3 A/cycle at deposition temperatures between 300 and 500° C. Films deposited on an ALD AlN surface had a slightly higher growth rate compared to the film deposited on a Si substrate at 300° C.

Figure 7:
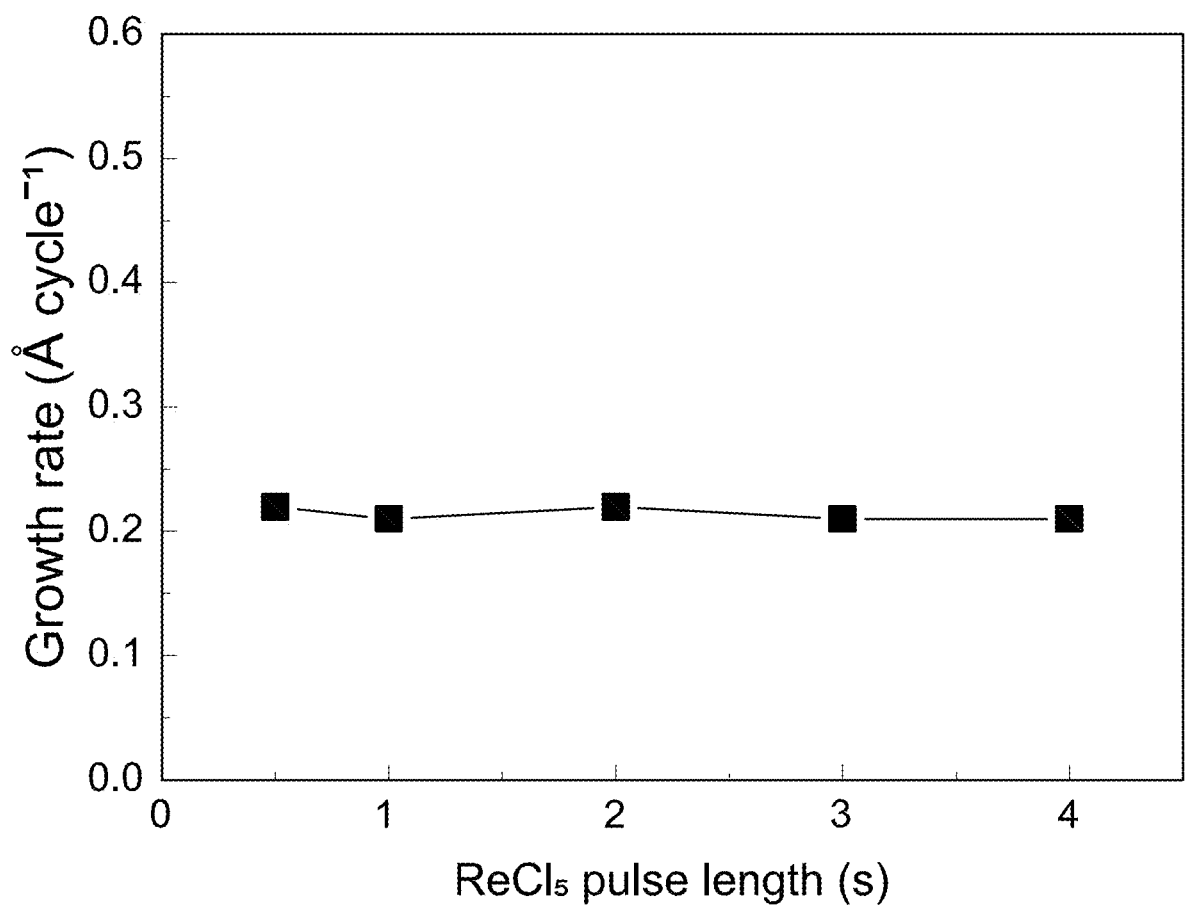
FIG. 7 illustrates the growth rate of rhenium thin films on $Al_2O_3$ at 400° C. as a function of $ReCl_5$ pulse length.
Figure 8:
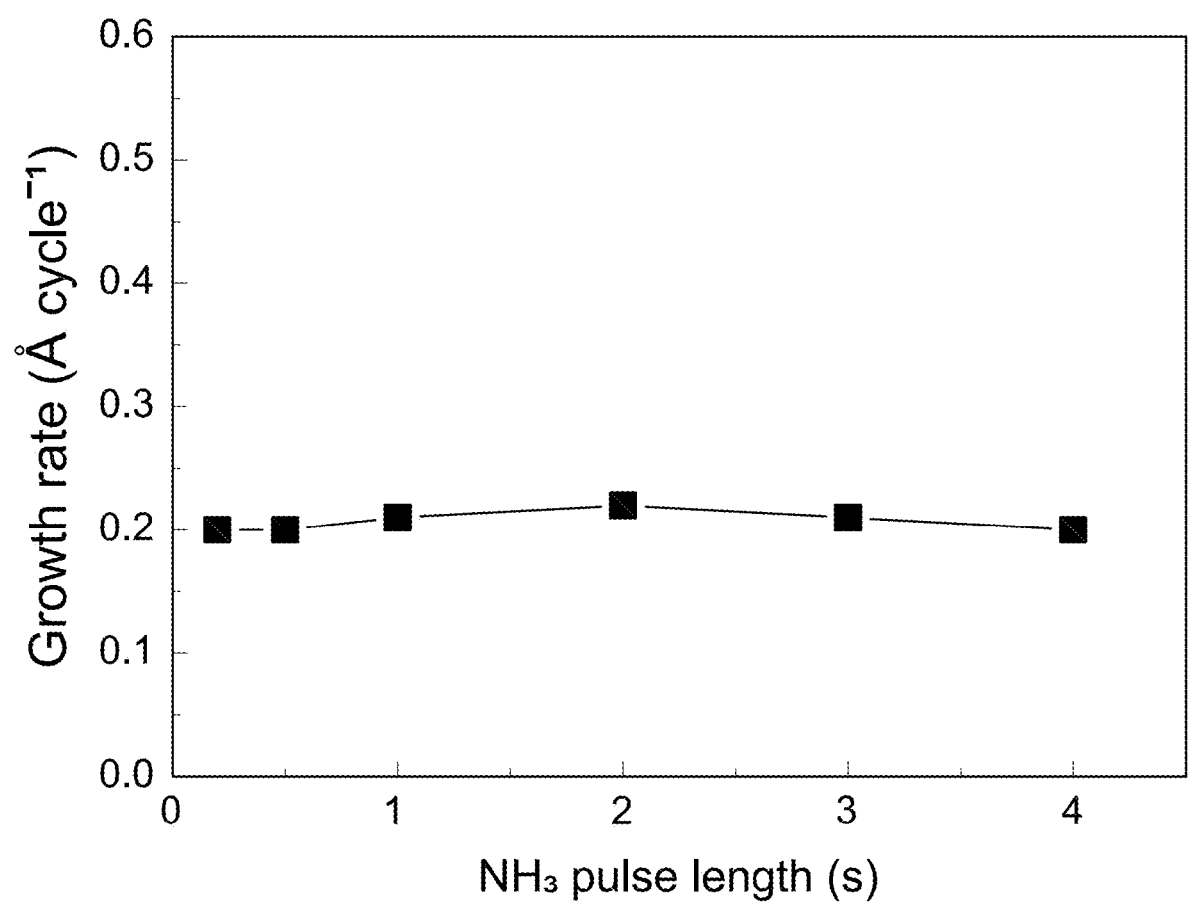
FIG. 8 illustrates the growth rate of rhenium thin films on $Al_2O_3$ at 400° C. as a function of $NH_3$ pulse length.

In other experiments rhenium films were deposited on an ALD-deposited aluminum oxide surface by ALD using $ReCl_5$ and $NH_3$ as reactants. The ALD process comprised multiple deposition cycles in which the substrate was contacted with a pulse of $ReCl_5$, the reaction space was purged for a first period of time, the substrate was contacted with a pulse of $NH_3$ and the reaction space was purged for a second time. FIG. 7 illustrates the growth of rhenium thin films as a function of $ReCl_5$ pulse length for 1000 cycles of the ALD process at 400° C. The $ReCl_5$ pulse length was varied from 0.5 to 4 seconds, while the $NH_3$ pulse length was maintained at 2 seconds. The purge length was 1 second. FIG. 8 shows the growth rate of the rhenium thin film when the $NH_3$ pulse length was varied from 0.25 to 4 seconds and the $ReCl_5$ pulse length was maintained at 2 seconds.

Figure 9:
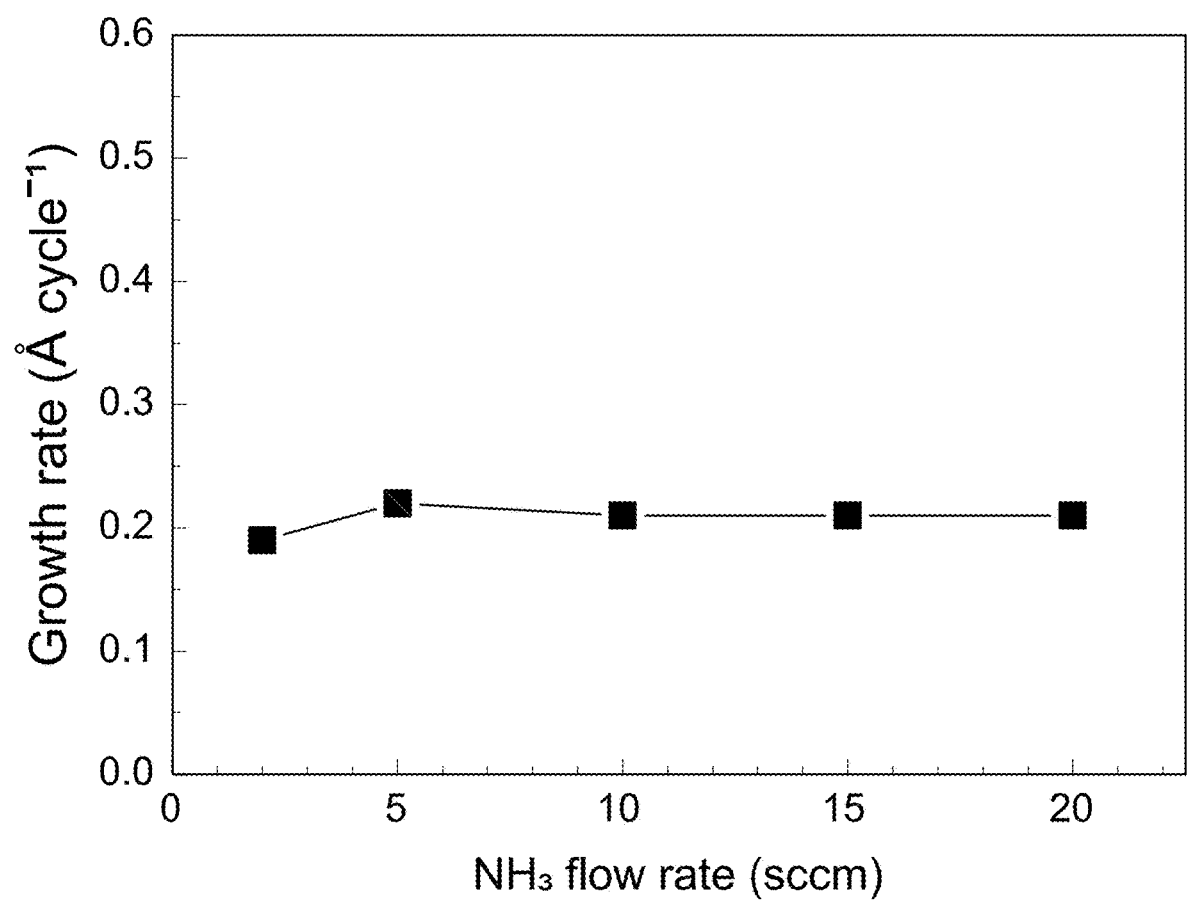
FIG. 9 illustrates the growth rate of rhenium thin films grown on $Al_2O_3$ at 400° C. as a function of $NH_3$ flow rate.

FIG. 9 illustrates the growth rate of the rhenium thin film on aluminum oxide as a function of $NH_3$ flow rate. The pulse length of precursors was 2 seconds and the purge was 1 second. Again, a total of 1000 deposition cycles was carried out at a temperature of 400° C.

Figure 10:
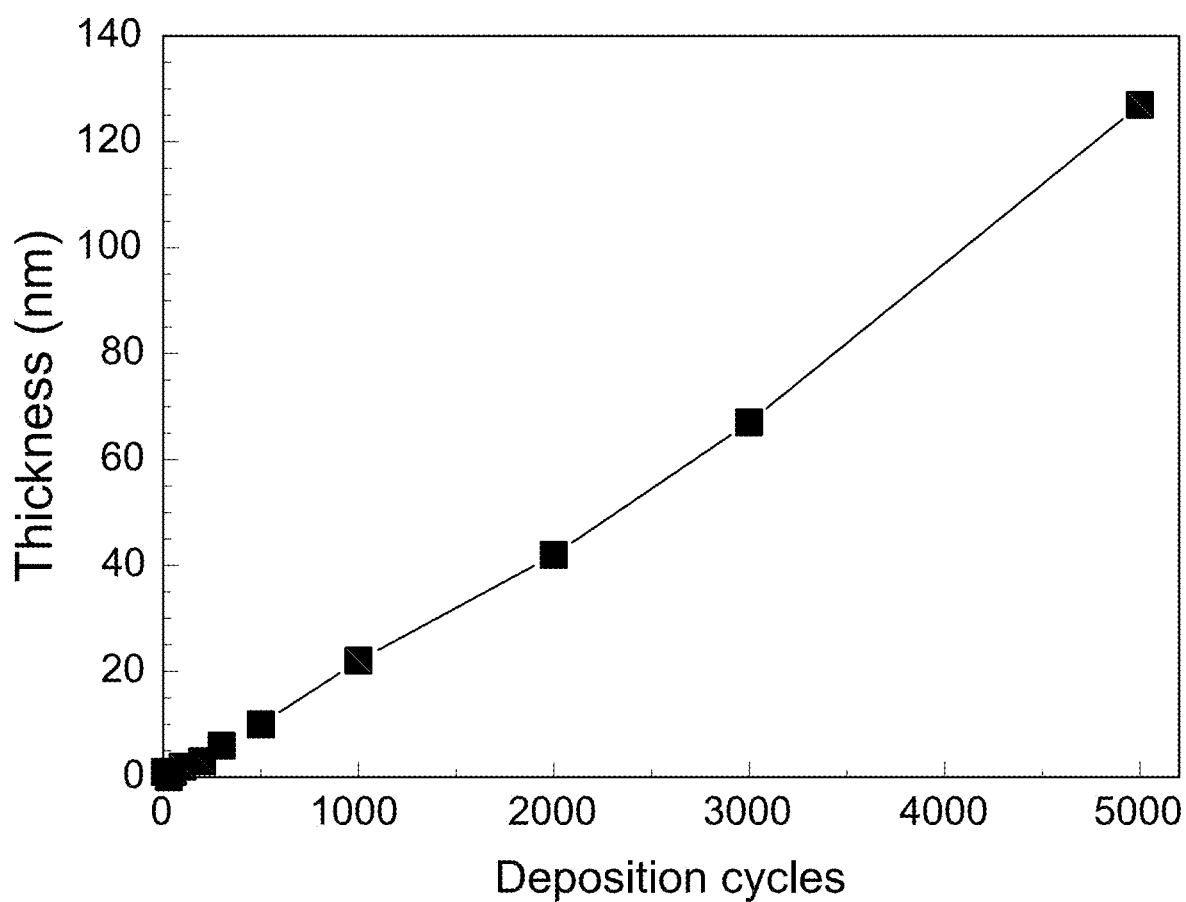
FIG. 10 illustrates film thickness of rhenium thin films grown on $Al_2O_3$ at 400° C.

FIG. 10 shows the increase in rhenium thin film thickness as a function of number of deposition cycles. As in the above experiments, deposition was on aluminum oxide films at 400° C. using $ReCl_5$ and $NH_3$ pulses of 2 seconds and purges of 1 second each.

Figure 11:
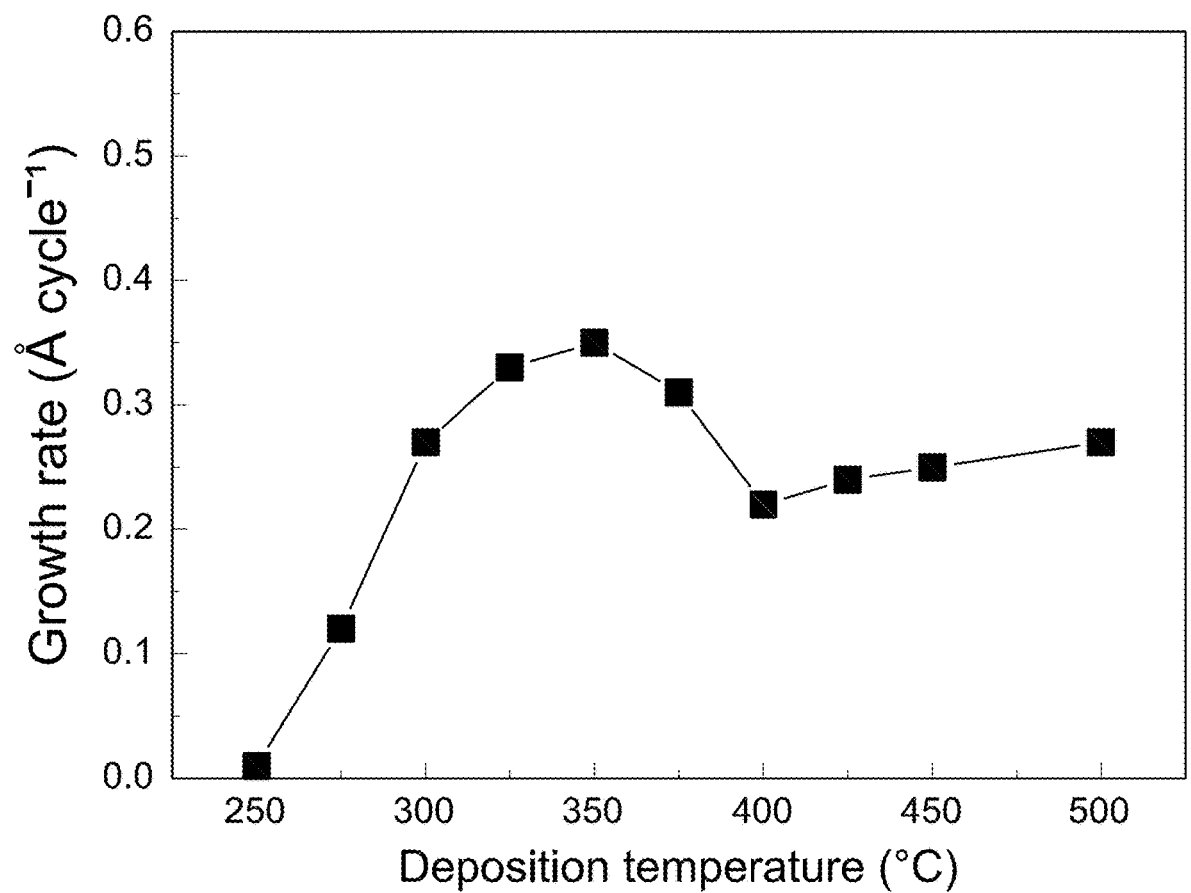
FIG. 11 illustrates the growth rate of rhenium thin films grown on $Al_2O_3$ as a function of deposition temperature.

FIG. 11 shows the growth rate of rhenium thin films on aluminum oxide as a function of deposition temperature, using reactant pulse lengths of 2 second, and purge lengths of 1 second for 1000 deposition cycles.

Figure 12:
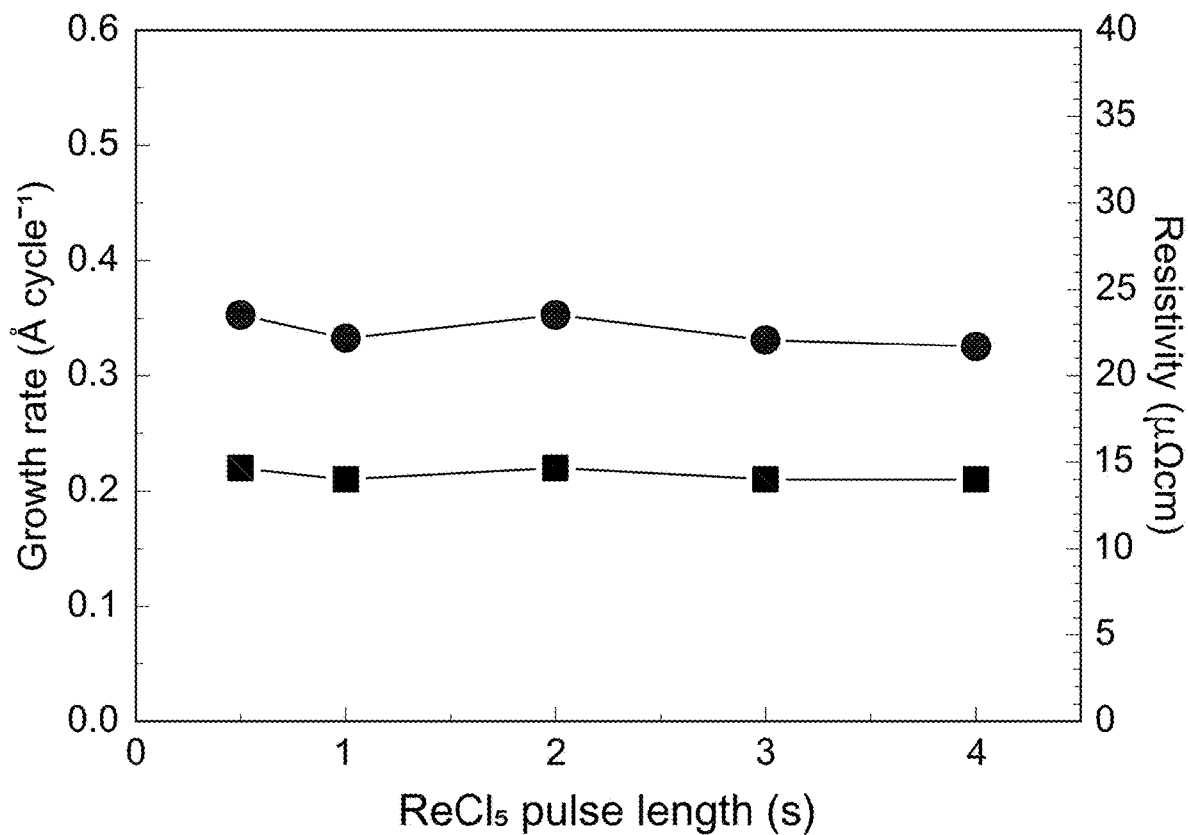
FIG. 12 illustrates the growth rates (squares) and resistivities (circles) of rhenium thin films grown on $Al_2O_3$ films at 400° C. as a function of $ReCl_5$ pulse length.

FIG. 12 illustrates the growth rates and resistivities of rhenium thin films grown on $Al_2O_3$ films at 400° C. as a function of $ReCl_5$ pulse length using $NH_3$ as the second reactant. The pulse length of $NH_3$ was 2 s and all purges were 1 s. A total of 1000 deposition cycles was used.

Figure 13:
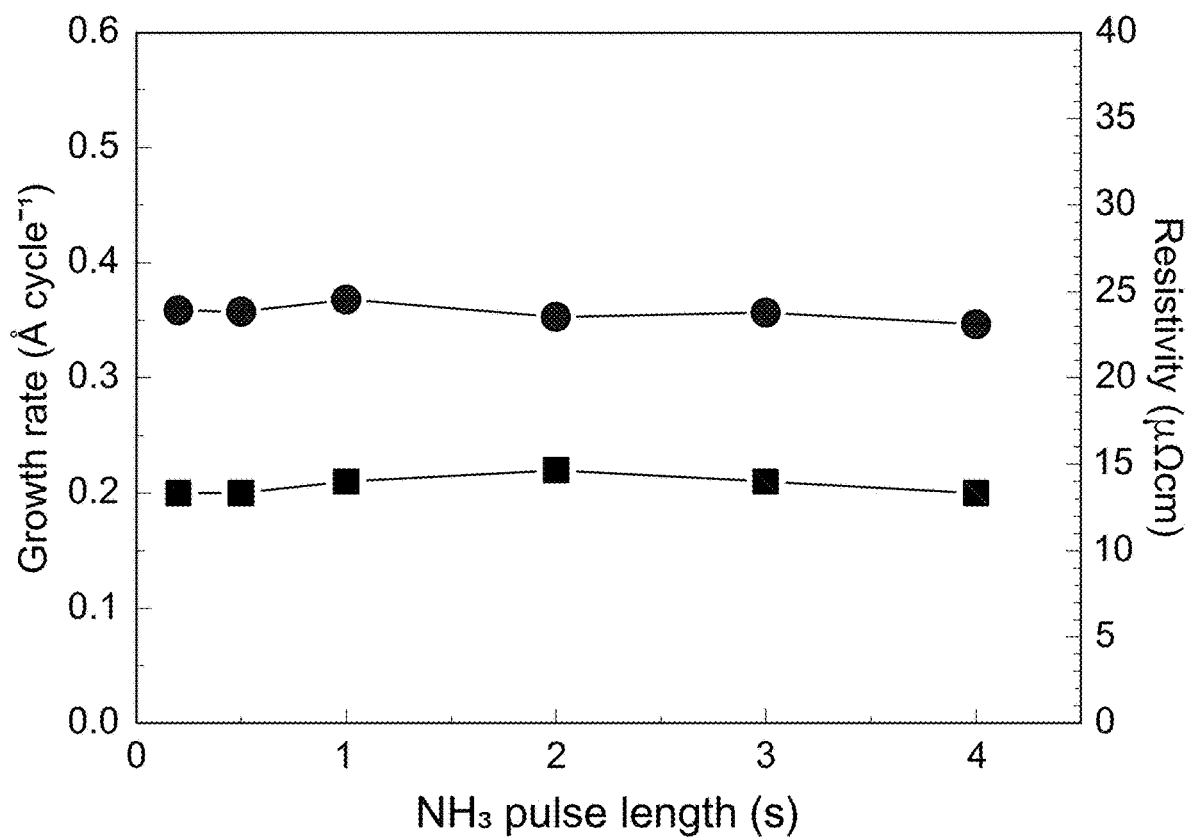
FIG. 13 illustrates growth rates (squares) and resistivities (circles) of rhenium-containing thin films grown on $Al_2O_3$ at 400° C. as a function of $NH_3$ pulse length.

FIG. 13 illustrates growth rates and resistivities of rhenium-containing thin films grown on $Al_2O_3$ at 400° C. as a function of $NH_3$ pulse length. The pulse length of $ReCl_5$ was 2 s and all purges were 1 s each. A total of 1000 deposition cycles was used.

Figure 14:
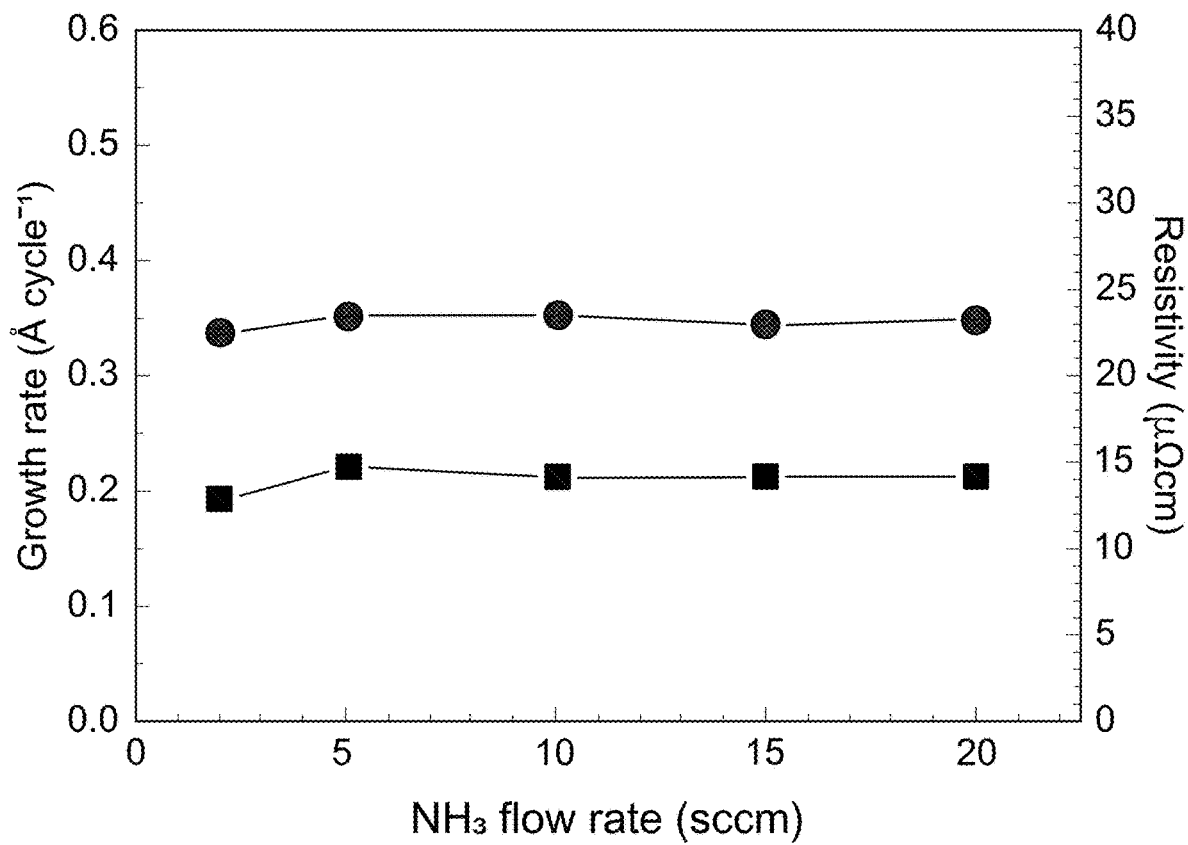
FIG. 14 illustrates growth rates (squares) and resistivities (circles) of rhenium thin films grown on $Al_2O_3$ at 400° C. as a function of $NH_3$ flow rate.

FIG. 14 illustrates growth rate and resistivities of rhenium thin films grown on $Al_2O_3$ at 400° C. as a function of $NH_3$ flow rate. The pulse lengths of the precursors and purges were 2 s and 1 s respectively. A total of 1000 deposition cycles was used.

Figure 15:
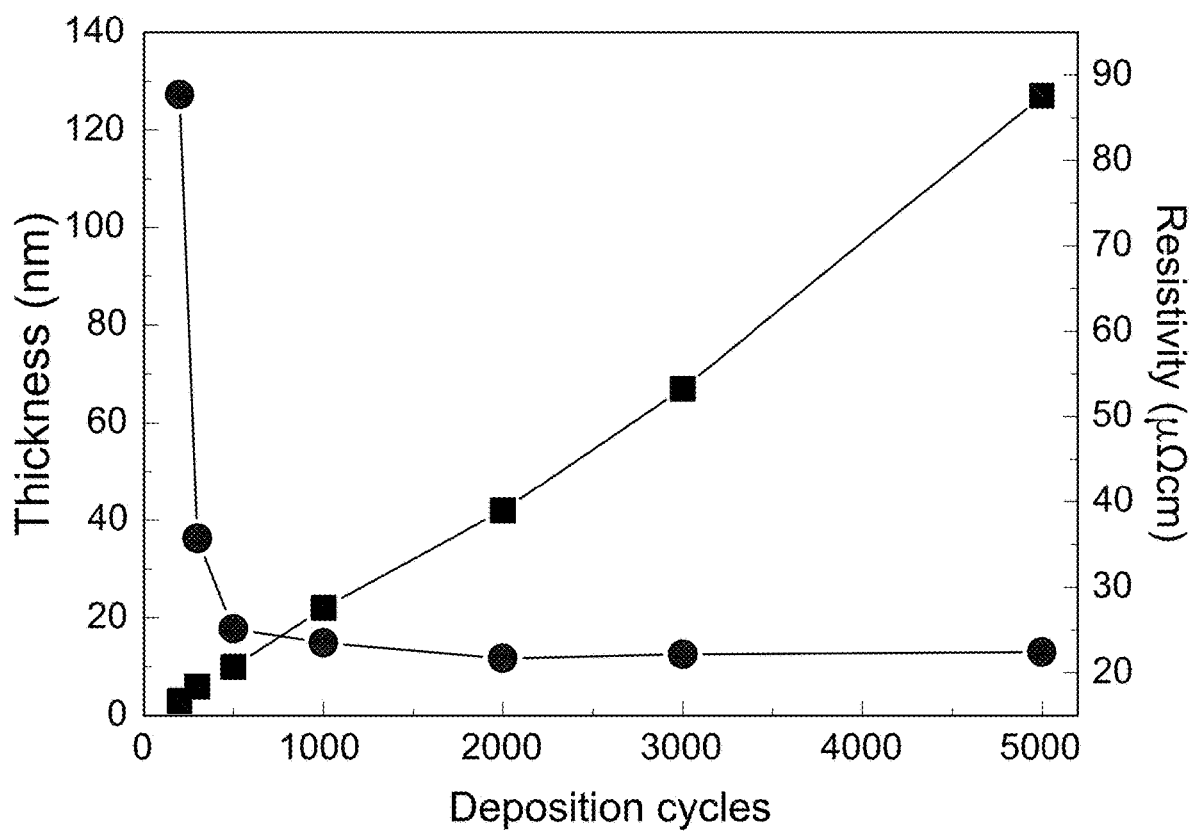
FIG. 15 illustrates the thickness (squares) and resistivities (circles) of rhenium thin films grown on $Al_2O_3$ from $ReCl_5$ and $NH_3$ at 400° C. as a function of the number of deposition cycles.
Figure 16:
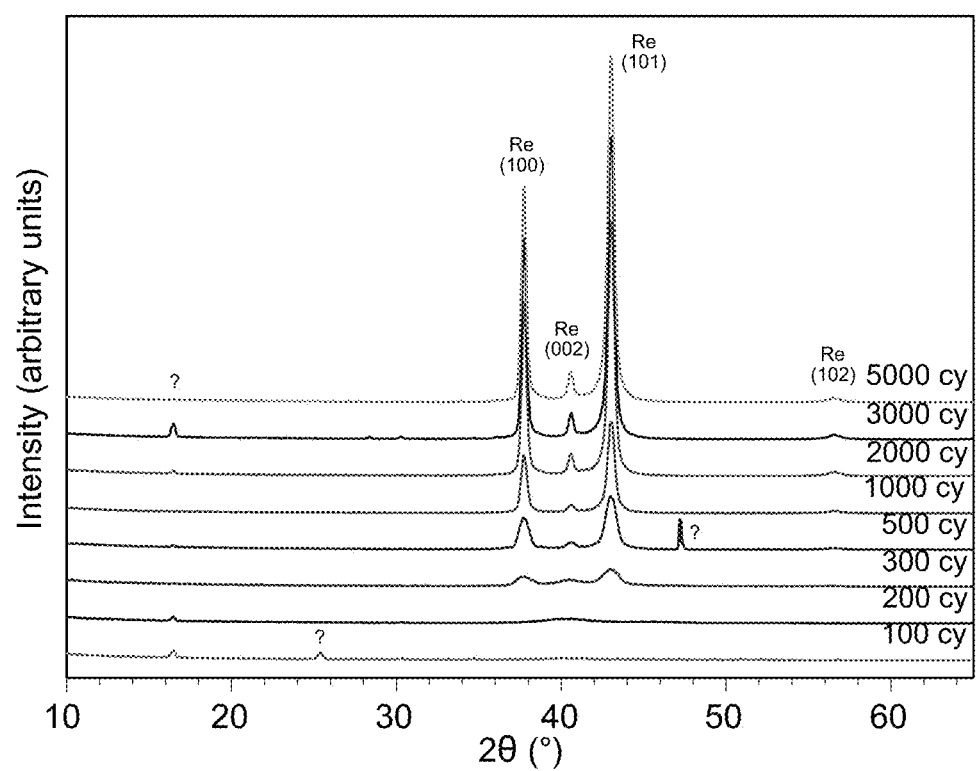
FIG. 16 shows GIXRD patterns for rhenium thin films grown on $Al_2O_3$ at 400° C. from $ReCl_5$ and $NH_3$ as a function of number of deposition cycles.
Figure 17:
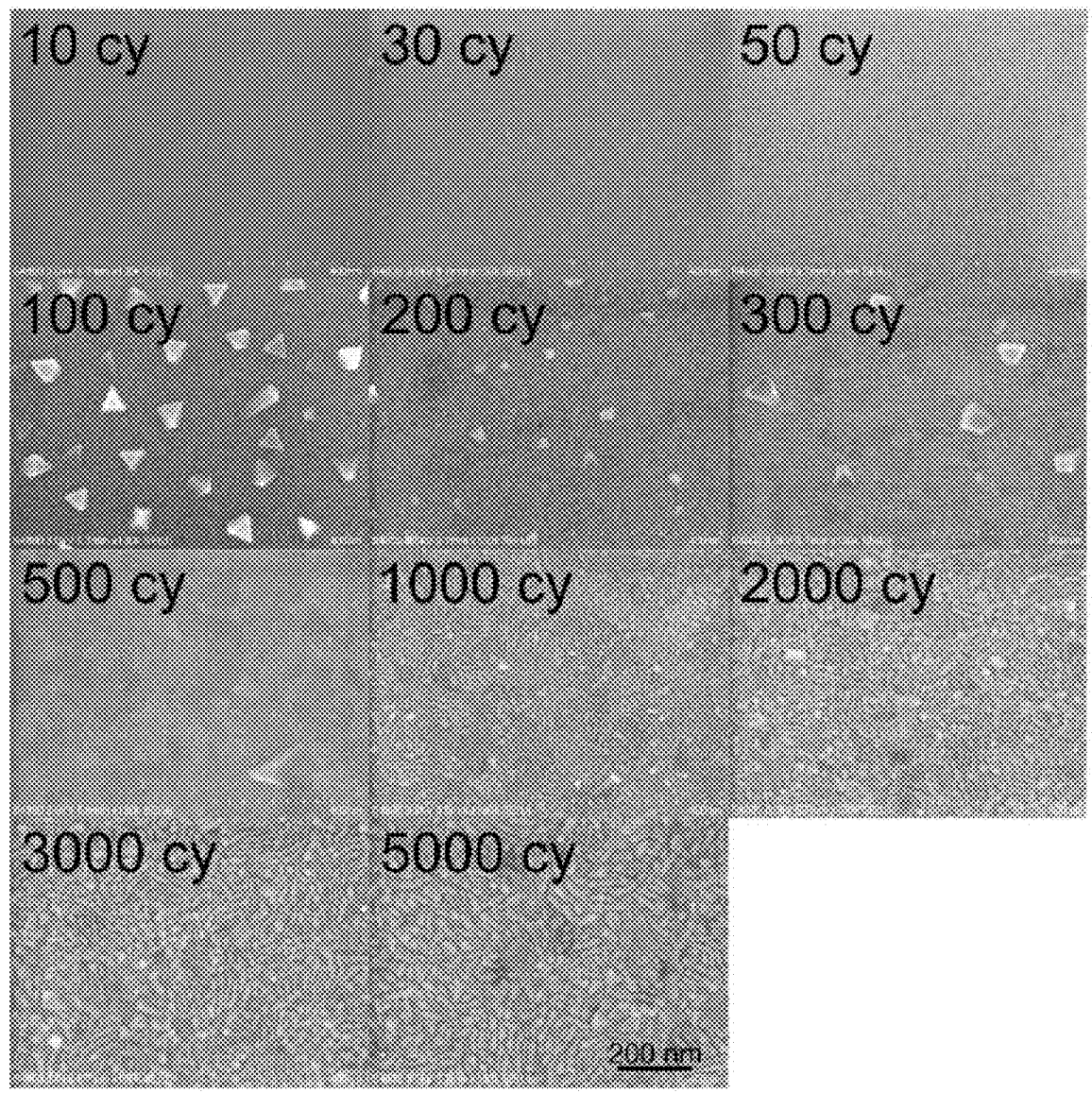
FIG. 17 shows FSEM images of rhenium films grown on $Al_2O_3$ at 400° C. from $ReCl_5$ and $NH_3$ at various numbers of deposition cycles.

FIG. 15 illustrates the thickness and resistivities of rhenium thin films grown on $Al_2O_3$ from $ReCl_5$ and $NH_3$ at 400° C. as a function of the number of deposition cycles. The pulse lengths of the precursors and purges were 2 s and 1 s each, respectively. FIG. 16 shows GIXRD patterns for rhenium thin films grown on $Al_2O_3$ at 400° C. from $ReCl_5$ and $NH_3$ as a function of number of deposition cycles. FIG. 17 shows FSEM images of the films.

Figure 18:
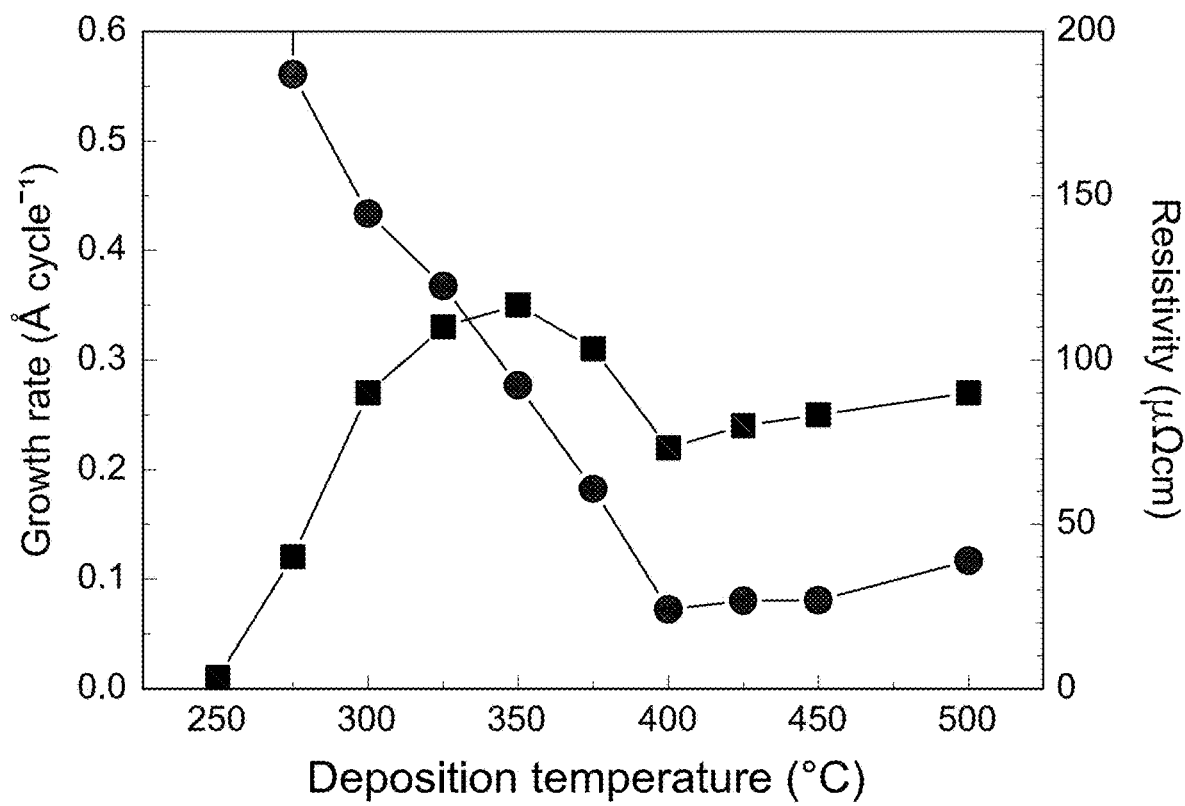
FIG. 18 shows the growth rates (squares) and resistivities (circles) of rhenium nitride and rhenium metal films grown on $Al_2O_3$ as a function of deposition temperature.
Figure 19:
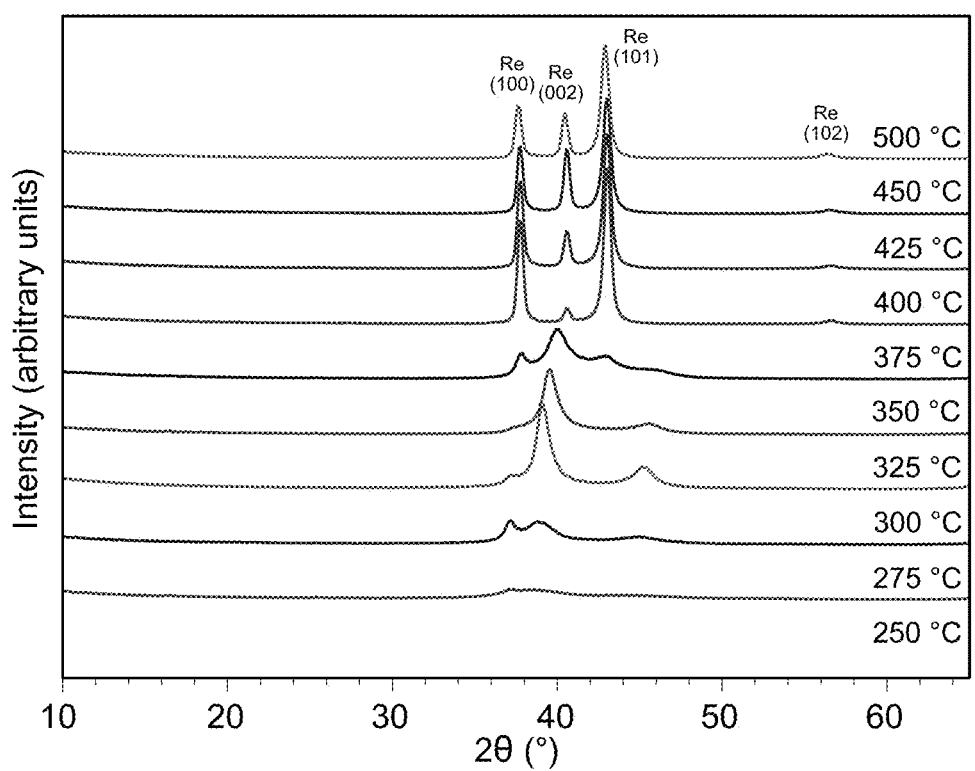
FIG. 19 shows the GIXRD patterns of the rhenium nitride and rhenium metal films grown on $Al_2O_3$ as a function of deposition temperature.
Figure 21:
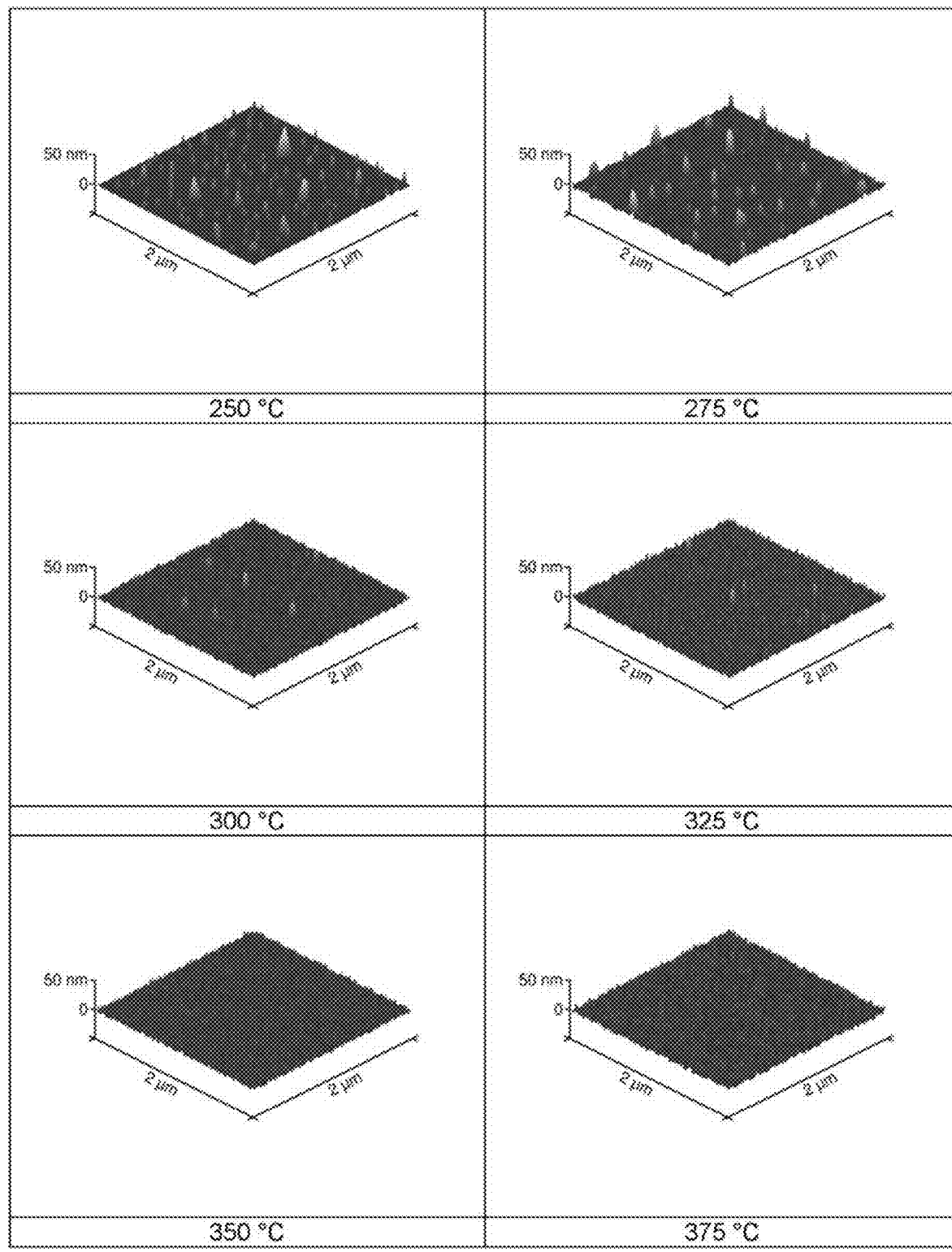
FIG. 21 provides AFM images (2 micron×2 micron) of the rhenium metal and rhenium nitride films gown on $Al_2O_3$ as a function of temperature.

Rhenium nitride and rhenium metal films were grown by ALD on $Al_2O_3$ using $ReCl_5$ and $NH_3$. FIG. 18 shows the growth rates and resistivities of the films as a function of deposition temperature. The pulse and purge lengths were 1 s each, and a total of 1000 deposition cycles was used. FIG. 19 shows the GIXRD patterns of the rhenium nitride and rhenium metal films. FIG. 20 provides the film thickness and surface roughness of the rhenium metal and rhenium nitride films deposited between 250° C. and 500° C. FIG. 21 provides AFM images (2 micron×2 micron) of the rhenium metal and rhenium nitride films gown on $Al_2O_3$ as a function of temperature.

Figure 22:
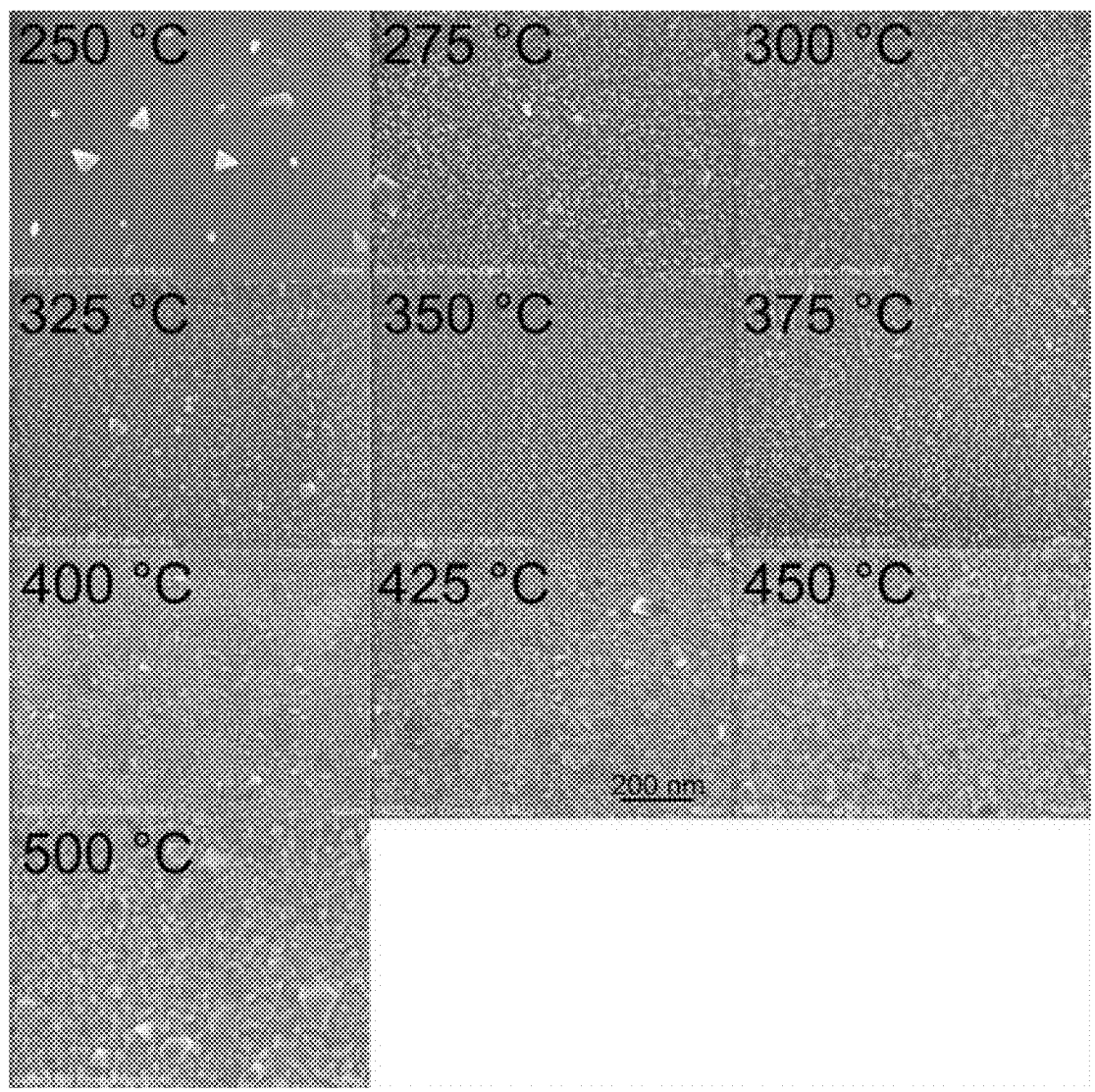
FIG. 22 shows FESEM images of rhenium-containing films grown on $Al_2O_3$ at various deposition temperatures.

FIG. 22 shows FESEM images of rhenium and rhenium nitride films grown on $Al_2O_3$ films at deposition temperatures between 250° C. and 500° C. in a commercial hot-wall flow-type F-120 ALD reactor (ASM Microchemistry Ltd). In-situ 5-10 nm $Al_2O_3$ coated 5×5 $cm^2$ Si(100) substrates were used. As in the above experiments, $ReCl_5$ and $NH_3$ pulses of 2 seconds and purges of 1 second each were used. The total number of deposition cycles at each temperature was 1000.

FIG. 23 shows the elemental composition, impurity content and stoichiometry of the rhenium metal/rhenium nitride films deposited between 250° C. and 500° C. as analyzed by TOF-ERDA. The $Al_2O_3$ film was determined from the thinnest $ReN_x$ sample structures, and the $Al_2O_3$ layer was reduced from the samples by assuming the $Al_2O_3$ layer to be identical in each case. Thus, the O content is indicative only.

Rhenium Sulfide Deposition

Figure 24:
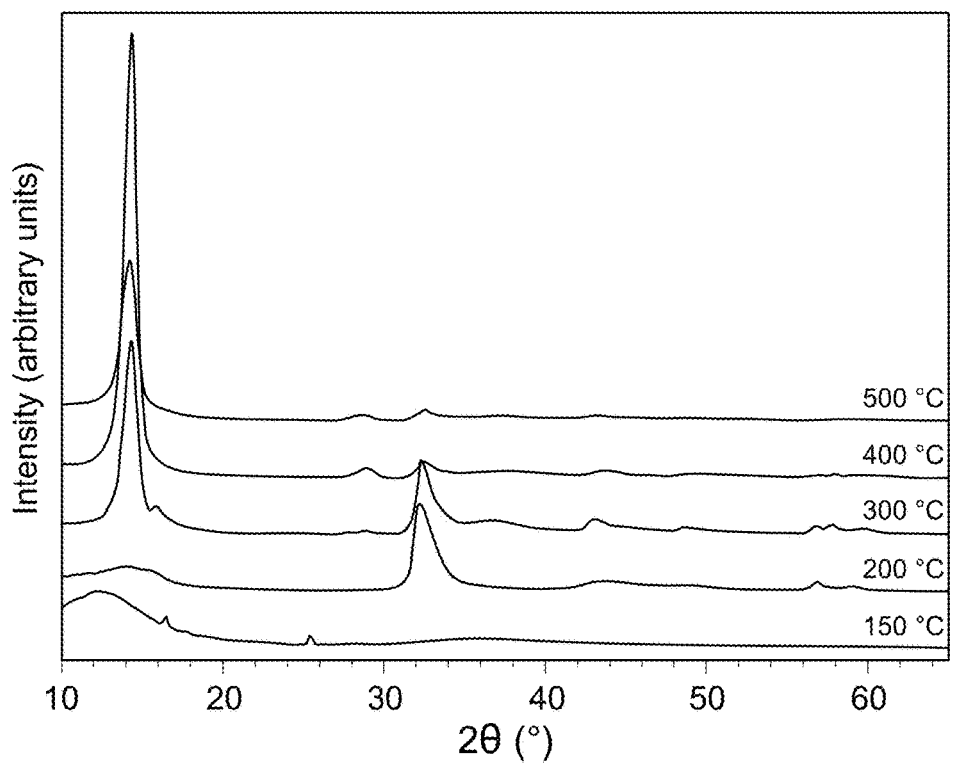
FIG. 24 provides GIXRD patterns of the rhenium sulfide films deposited at temperatures between 150 and 500° C. on Si substrates. A total of 1000 cycles were applied.
Figure 25:
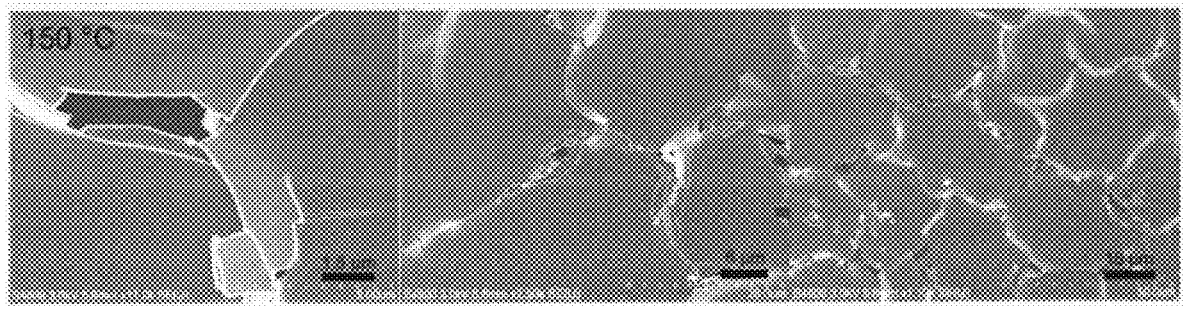
FIG. 25 provides FESEM images of the rhenium sulfide film deposited at 150° C. after change in visual appearance due to contact with a plastic bag surface.

Rhenium sulfide was deposited by ALD using $ReCl_5$ and $H_2S$ as precursors. FIG. 24 presents the GIXRD patterns obtained from films grown on Si substrates at deposition temperatures between 150 and 500° C. The films grown between 200 and 500° C. could be identified as anorthic $ReS_2$ (00-024-0922; unnamed mineral, syn [NR]), however the pattern has a number of peaks. The highest intensity in the patterns is visible around 14-15° and is $ReS_2$ (001), whereas the low intensity peak next to it and visible at 300° C. is $ReS_2$ (100). The main peak visible at around 32° in the films grown at 200 and 300° C. could belong to any of the $ReS_2$ (200) [32.113°], (0-21) [32.364], (-220) [32.766], or (-201) [32.915] peaks. The film grown at 150° C. was nearly X-ray amorphous, though it reacted with a plastic bag surface before the pattern was measured. The visible reaction may have been related to the cracking of the film as seen in FIG. 25.

Figure 26:
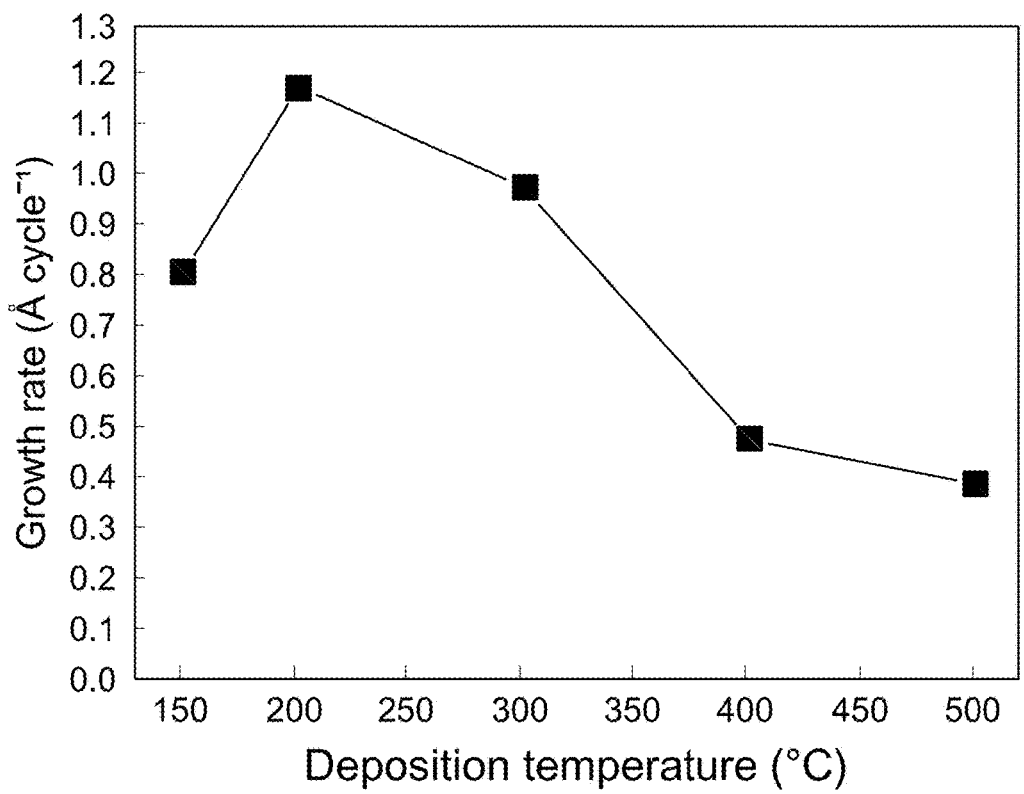
FIG. 26 illustrates growth rates of rhenium sulfide films as a function of deposition temperature. 1000 cycles were applied in each deposition.
Figure 27:
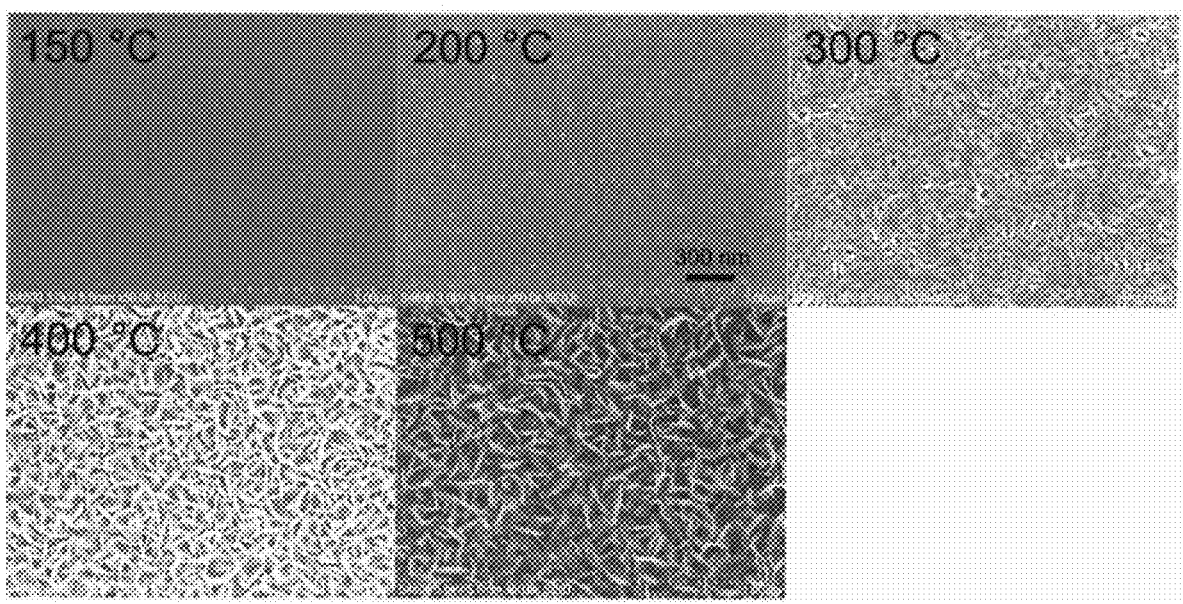
FIG. 27 provides FESEM images of the rhenium sulfide films grown between 150 and 500° C. on Si substrates using 1000 cycles.
Figure 28:
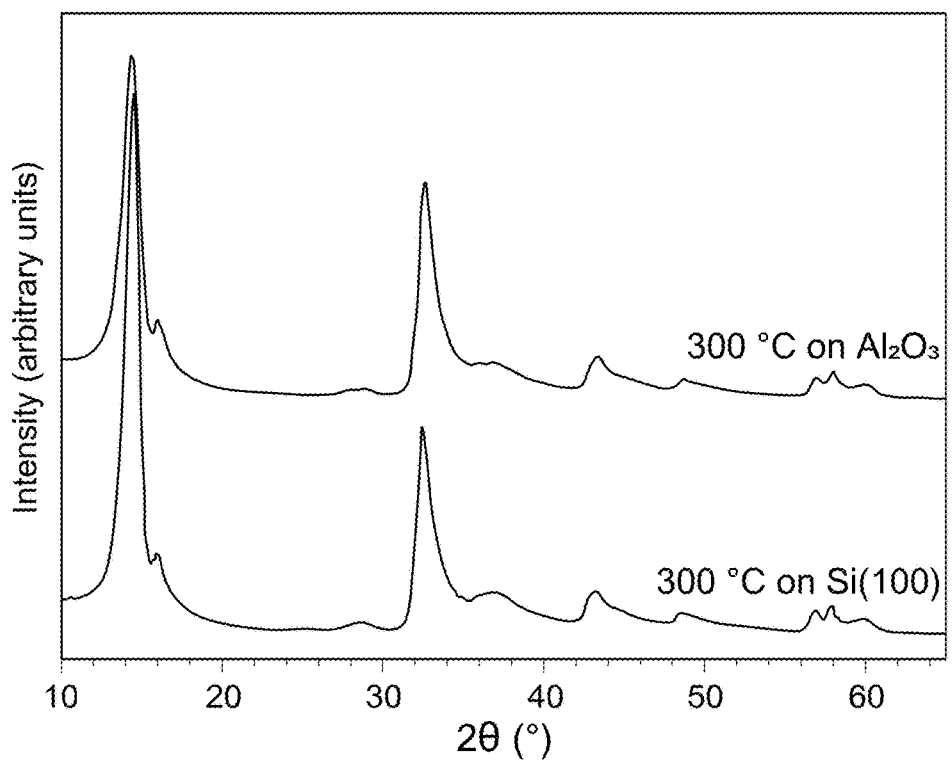
FIG. 28 shows GIXRD patterns of the rhenium sulfide films grown at 300° C. on native oxide covered Si and ALD-deposited $Al_2O_3$ surfaces. A total of 1000 cycles were applied.
Figure 29:
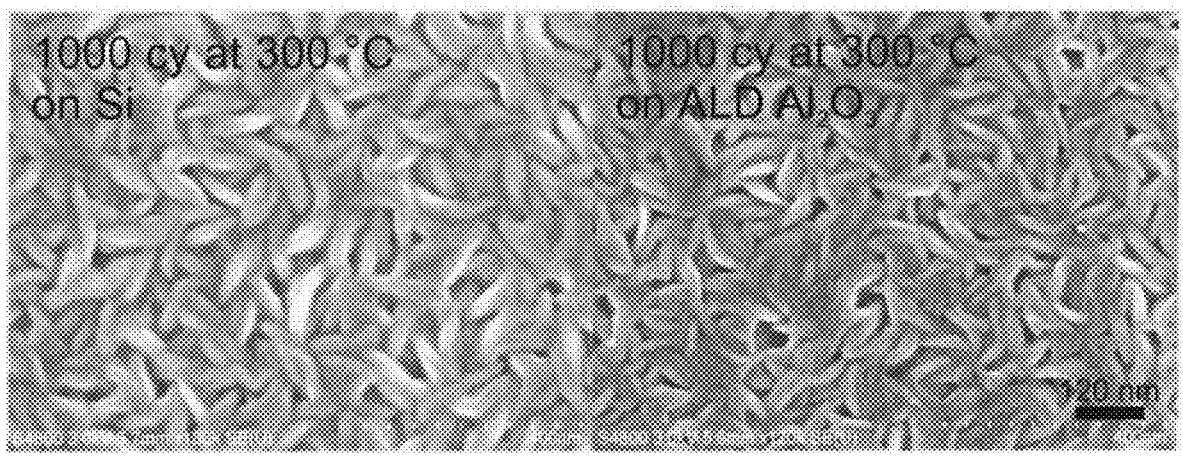
FIG. 29 provides FESEM images of the rhenium sulfide films deposited at 300° C. on native oxide covered Si and ALD-deposited $Al_2O_3$ surfaces using 1000 cycles.

The growth rates of the rhenium sulfide thin films on Si substrates are presented in FIG. 26. The film grown at 150° C. had a growth rate of about 0.8 A/cycle whereas the growth rate increased to about 1.2 A/cycle for the film grown at 200° C. The growth rate decreased as the deposition temperature increased, from 1.2 A/cycle at 200° C. to around 0.4 A/cycle at 500° C. The surface morphologies of the films are shown in FIG. 27. Comparison between the starting surfaces of native oxide covered Si and ALD grown Al2O3 did not reveal any difference for rhenium sulfide growth at 300° C. (FIGS. 28 and 29).

Figure 30:
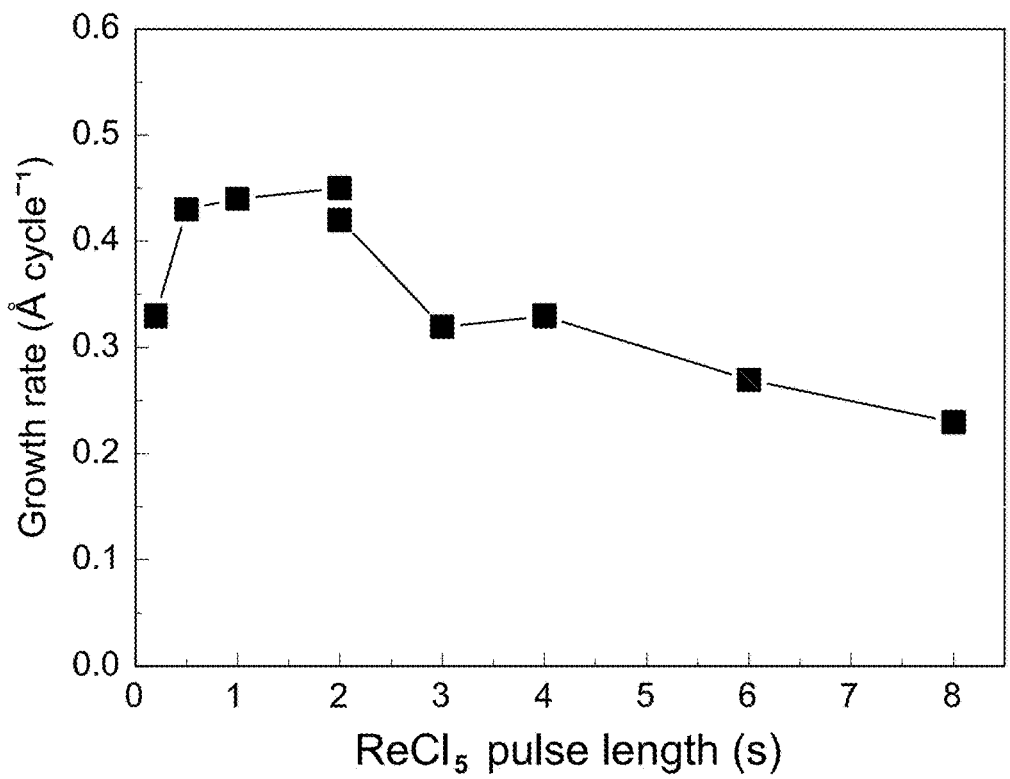
FIG. 30 illustrates the growth rate of rhenium sulfide films on $Al_2O_3$ at 400° C. as a function of $ReCl_5$ pulse length.
Figure 31:
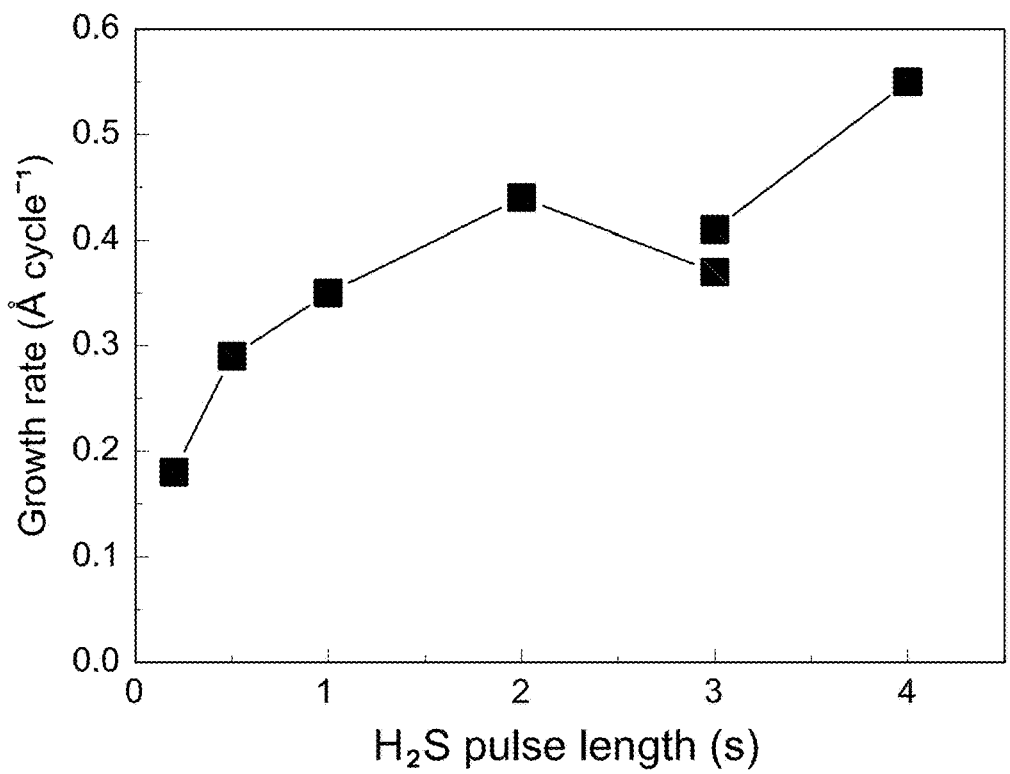
FIG. 31 shows the growth rate of rhenium sulfide films on $Al_2O_3$ as a function of $H_2S$ pulse length.
Figure 32:
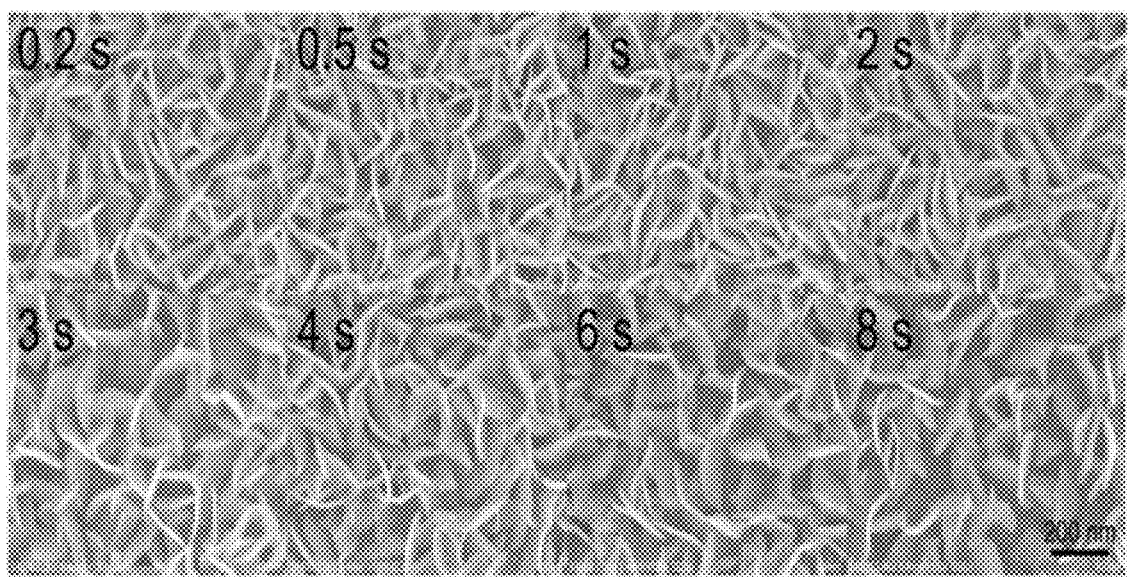
FIG. 32 shows FESM images of the films deposited using various $H_2S$ pulse lengths as indicated.

Rhenium sulfide was also deposited by ALD on ALD-grown $Al_2O_3$ films at various deposition temperatures from $ReCl_5$ and $H_2S$. The ALD process comprised multiple deposition cycles in which the substrate was contacted with a pulse of $ReCl_5$, the reaction space was purged for a first period of time, the substrate was contacted with a pulse of $H_2S$ and the reaction space was purged for a second time. FIG. 30 illustrates the growth rate of rhenium sulfide films on $Al_2O_3$ at 400° C. as a function of $ReCl_5$ pulse length. The pulse length of $H_2S$ was 2 seconds while the purge lengths were 1 second each. A total of 1000 deposition cycles were carried out. FIG. 31 shows the growth rate of rhenium sulfide films on $Al_2O_3$ as a function of $H_2S$ pulse length, with a $ReCl_5$ pulse length of 1 second and purge lengths of 1 second. Again, a total of 1000 deposition cycles were carried out at a deposition temperature of 400° C. FIG. 32 shows FSEM images of the films deposited with the various $H_2S$ pulse lengths.

Figure 33:
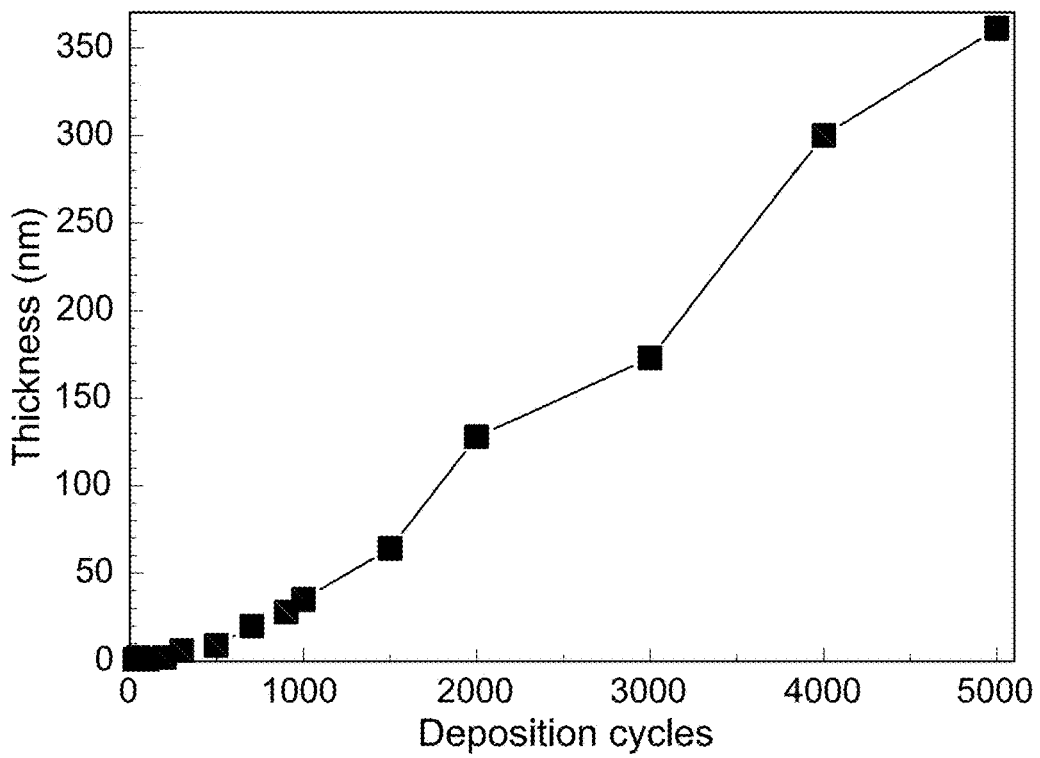
FIG. 33 shows the increasing thickness of rhenium sulfide films deposited on $Al_2O_3$ at 400° C. using 1 second pulses of $ReCl_5$ and $H_2S$, and 1 second purges.
Figure 34:
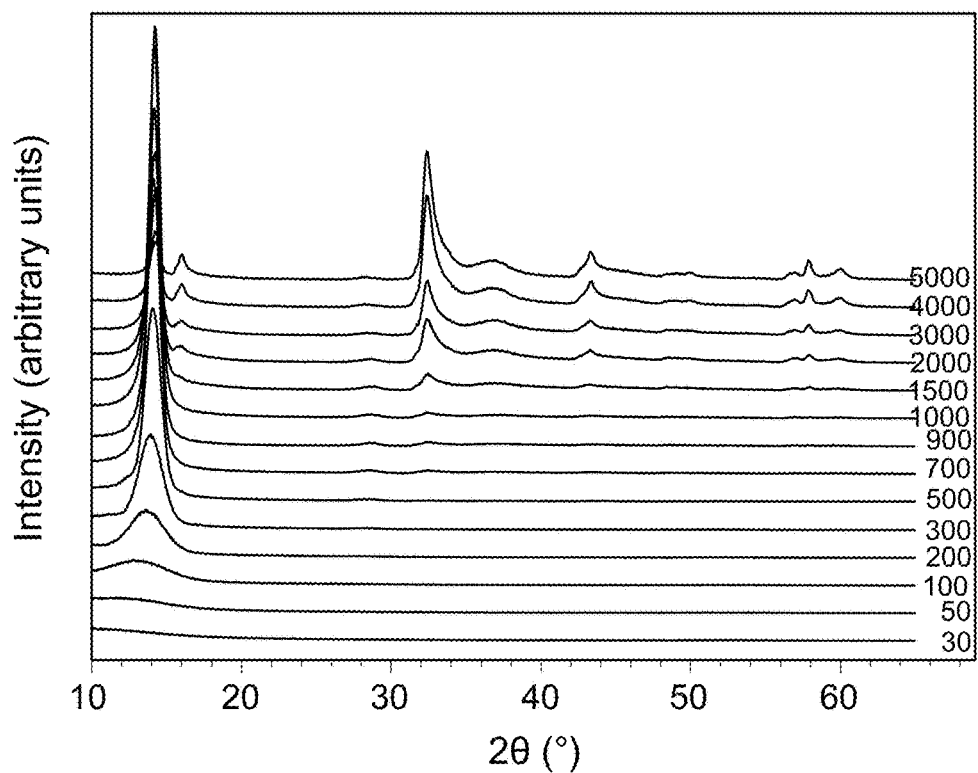
FIG. 34 shows the GXIRD patterns of the rhenium sulfide films deposited on $Al_2O_3$ at 400° C. with varying numbers of deposition cycles, as in FIG. 33.
Figure 35:
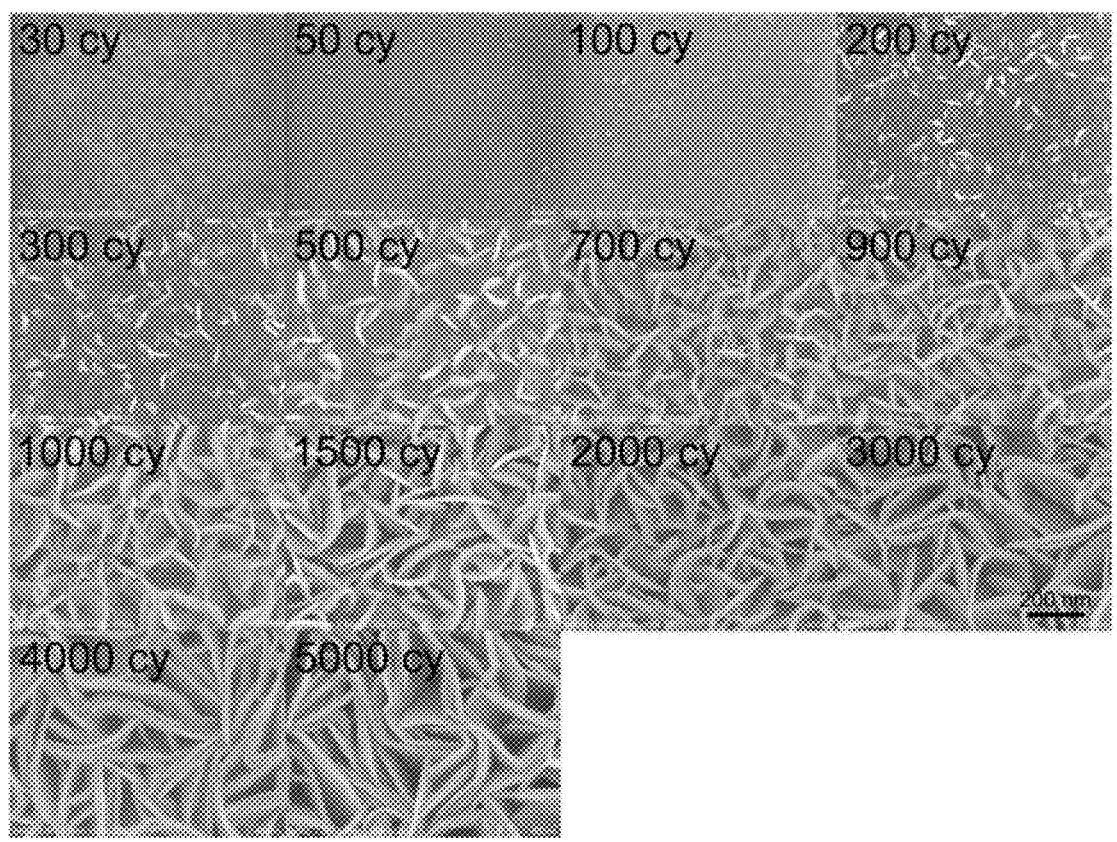
FIG. 35 shows FSEM images of the rhenium sulfide films deposited on $Al_2O_3$ at 400° C. with varying numbers of deposition cycles.
Figures 36, 37:
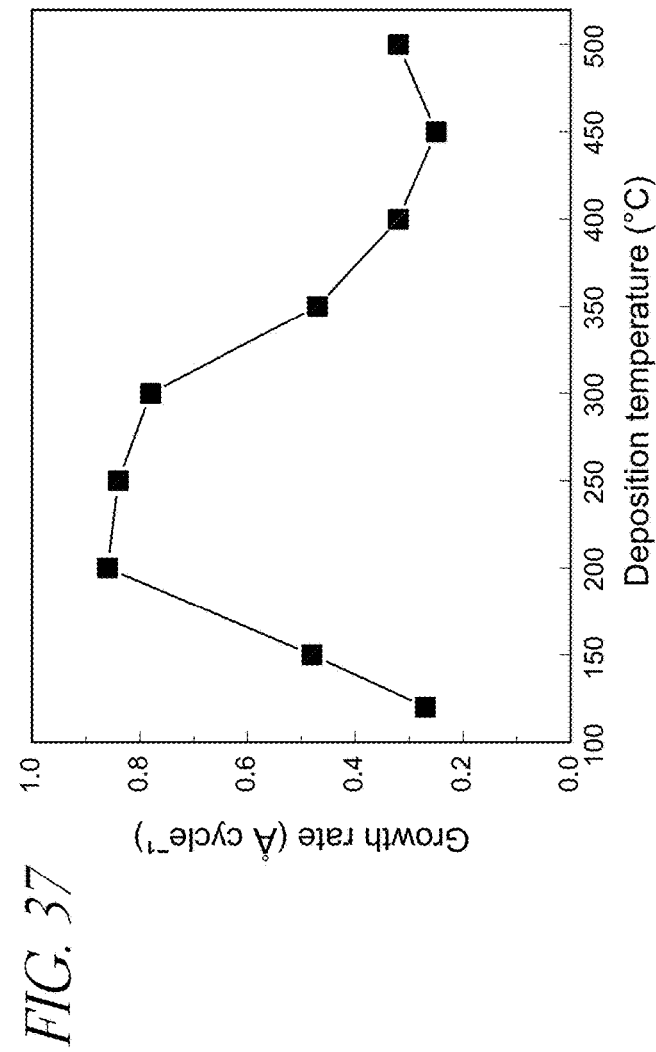
FIG. 36 provides the film thicknesses (d, calculated by EDX) and surface roughness ($R_q$, calculated by AFM) for the rhenium films deposited with varying number of deposition cycles.
FIG. 37 shows the growth rate of rhenium sulfide films grown on $Al_2O_3$ films as a function of deposition temperature.

FIG. 33 shows the increasing thickness of rhenium sulfide films deposited on $Al_2O_3$ at 400° C. using 1 second pulses of $ReCl_5$ and $H_2S$, and 1 second purges. FIG. 36 provides the film thicknesses (calculated by EDX) and surface roughness (calculated by AFM) for the rhenium films deposited with varying number of deposition cycles. GXIRD patterns of these rhenium sulfide films are shown in FIG. 34 and FSEM images of the rhenium sulfide films are shown in FIG. 35.

FIG. 37 shows the growth rate of rhenium sulfide films grown on $Al_2O_3$ films as a function of deposition temperature. The pulse lengths for the $ReCl_5$ and $H_2S$ were 1 second and the purge lengths were also 1 second each, for a total of 1000 deposition cycles. GXIRD data for these rhenium sulfide films are shown in FIG. 38 and FSEM images of the films are shown in FIG. 39. FIG. 40 shows the elemental composition, impurity content and stoichiometry of the rhenium sulfide films deposited between 120° C. and 500° C. as measured by TOF-ERDA. FIG. 41 shows the elemental composition, impurity content and stoichiometry of the same films as measured by XPS. At 120° C. and above, 80% of the rhenium is Re(IV). These films were deposited without optimization in a research reactor, and demonstrate that ReS films can be deposited. Further optimization can reduce the impurities and tune the composition as desired for particular situations.

Figure 42:
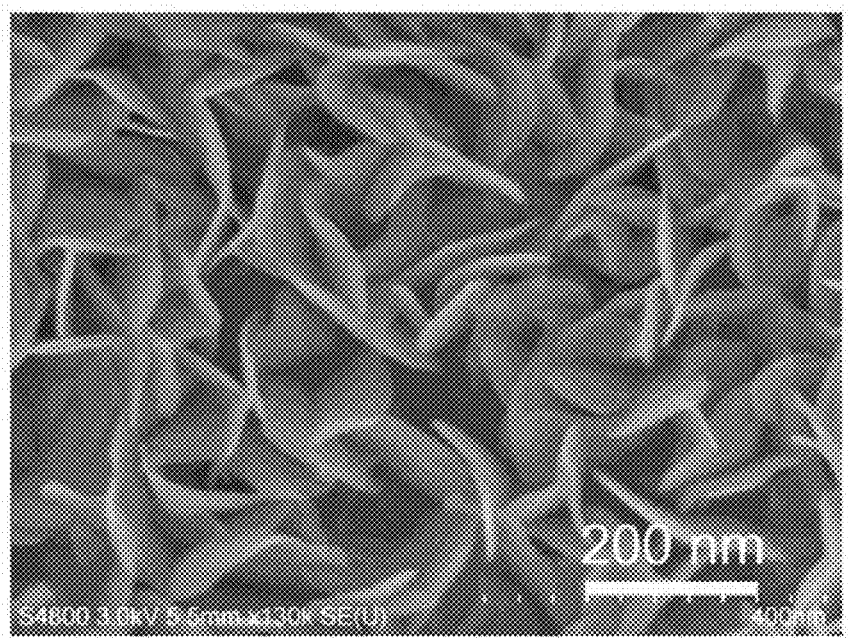
FIG. 42 is an FESEM image of an ALD $ReS_2$ film.
Figure 43:
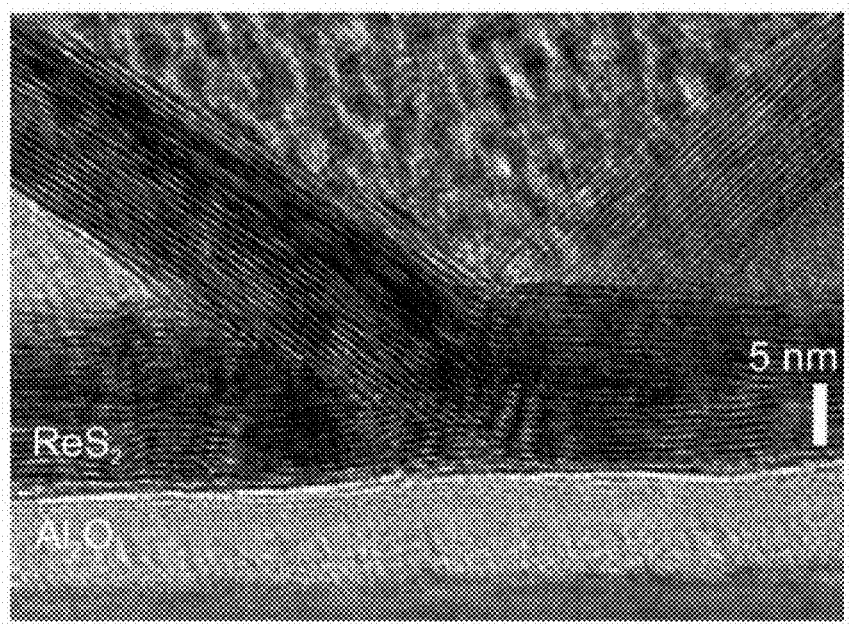
FIG. 43 is a TEM image of the ALD $ReS_2$ film of FIG. 42.
Figure 44A:
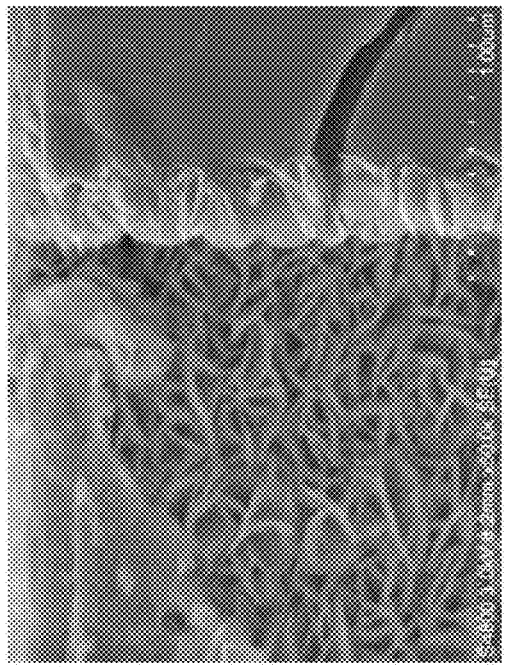
FIGS. 44A-D are FSEM images of a rhenium sulfide film deposited in a trench structure.
Figure 44B:
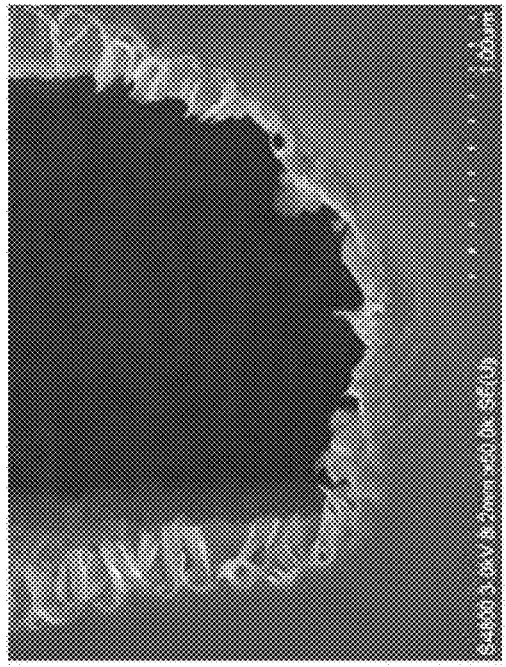
Figure 44C:
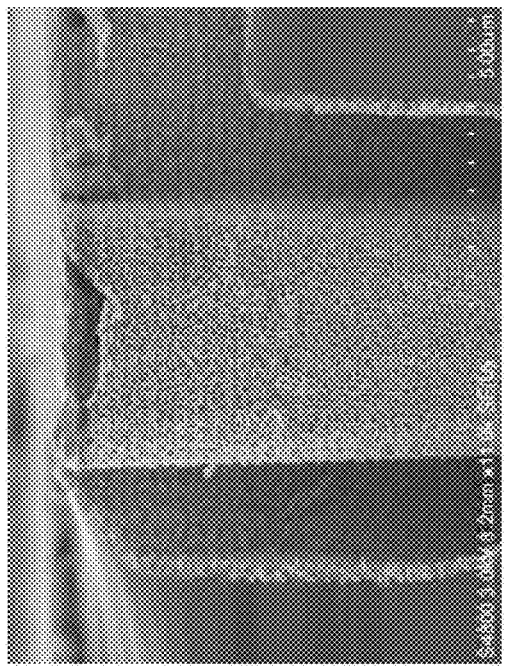
Figure 44D:
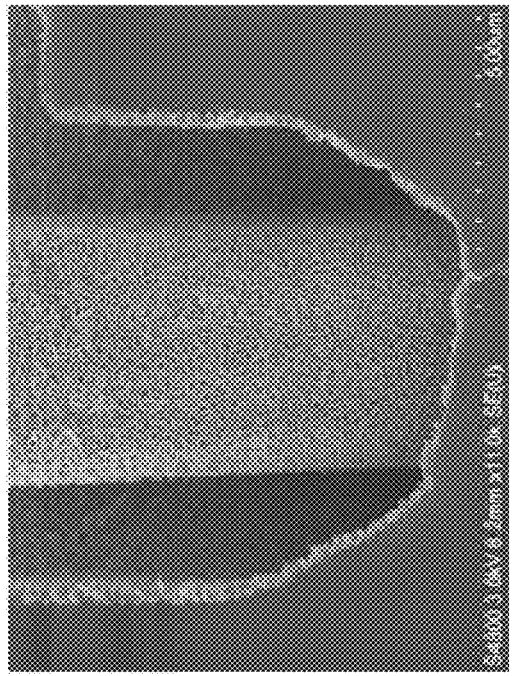

$ReS_2$ films were deposited on in-situ grown $Al_2O_3$ from $ReCl_5$ and $H_2S$ by ALD at deposition temperatures up to 500° C. An FESEM image of one of these ALD $ReS_2$ films is shown in FIG. 42. A TEM image of the same ALD $ReS_2$ film is shown in FIG. 43. FSEM images of rhenium sulfide films deposited in a trench structure are shown in FIGS. 44A-D.

What is claimed is:

1. A method for depositing a thin film comprising rhenium sulfide on a substrate, the method comprising two or more sequential deposition cycles each comprising alternately and sequentially contacting the substrate with a vapor-phase rhenium precursor comprising a rhenium halide compound and a vapor-phase sulfur reactant, wherein the deposition cycles are carried out at a deposition temperature of 200 to 350° C.

2. The method of claim 1, wherein the method is an atomic layer deposition (ALD) process.

3. The method of claim 1, wherein the method is a sequential or pulsed chemical vapor deposition (CVD) process.

4. The method of claim 1, wherein the vapor-phase rhenium precursor comprises $ReCl_5$ or $ReF_6$.

5. The method of claim 1, wherein the vapor-phase sulfur reactant comprises hydrogen and sulfur.

6. The method of claim 1, wherein the vapor-phase sulfur reactant is an alkylsulfur compound.

7. The method of claim 1, wherein the vapor-phase sulfur reactant comprises elemental sulfur.

8. The method of claim 1, wherein the vapor-phase sulfur reactant has the formula R-S-H, wherein R is a substituted or unsubstituted hydrocarbon.

9. The method of claim 8, wherein R is a C1-C8 alkyl or substituted alkyl.

10. The method of claim 1, wherein the vapor-phase sulfur reactant comprises $H_2S_n$, wherein n is from 4 to 10.

11. The method of claim 1, wherein the vapor-phase sulfur reactant comprises one or more of $H_2S$, $(CH_3)_2S$, $(NH_4)_2S$, $((CH_3)_2SO)$, and $H_2S_2$.

12. The method of claim 1, wherein the vapor-phase sulfur reactant comprises $(NH_4)_2S$.

13. The method of claim 1, wherein the rhenium sulfide thin film comprises $ReS_2$.

14. The method of claim 1, wherein the rhenium sulfide thin film comprises $ReS_2$, the vapor-phase rhenium precursor comprises $ReCl_5$ and the vapor-phase sulfur reactant comprises $H_2S$.

15. The method of claim 1, wherein the rhenium sulfide thin film comprises a two-dimensional material.

16. The method of claim 1, wherein the rhenium sulfide thin film serves as a high mobility channel material in a logic device.

17. The method of claim 1, wherein the deposition cycles are repeated sequentially to form 20 molecular layers of $ReS_2$ or less.

18. The method of claim 1, wherein the rhenium sulfide thin film has an S:Re ratio from 0.5 to 3.

19. The method of claim 1, wherein the rhenium sulfide thin film is deposited on a three-dimensional structure with step coverage of greater than 90%.

20. The method of claim 1, wherein the rhenium sulfide thin film contains less than 20-at % hydrogen, less than 2 at-% carbon and less than 20 at-% oxygen.

21. The method of claim 1, wherein the rhenium sulfide thin film contains less than 10 at-% Cl.

* * * * *